(12) United States Patent
Hsu et al.

(10) Patent No.: US 11,894,460 B2
(45) Date of Patent: Feb. 6, 2024

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Chung-Wei Hsu, Hsinchu (TW); Kuo-Cheng Chiang, Hsinchu (TW); Mao-Lin Huang, Hsinchu (TW); Lung-Kun Chu, New Taipei (TW); Jia-Ni Yu, New Taipei (TW); Kuan-Lun Cheng, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 220 days.

(21) Appl. No.: 17/218,143

(22) Filed: Mar. 30, 2021

(65) Prior Publication Data
US 2022/0320342 A1 Oct. 6, 2022

(51) Int. Cl.
*H01L 29/78* (2006.01)
*H01L 29/06* (2006.01)
*H01L 29/423* (2006.01)
*H01L 29/49* (2006.01)
*H01L 29/786* (2006.01)
(Continued)

(52) U.S. Cl.
CPC .. *H01L 29/78391* (2014.09); *H01L 21/02057* (2013.01); *H01L 21/02236* (2013.01); *H01L 21/02603* (2013.01); *H01L 29/0673* (2013.01); *H01L 29/42392* (2013.01); *H01L 29/4908* (2013.01); *H01L 29/6684* (2013.01); *H01L 29/66545* (2013.01); *H01L 29/66742* (2013.01); *H01L 29/78696* (2013.01)

(58) Field of Classification Search
CPC ......... H01L 29/78391; H01L 21/02057; H01L 21/02236; H01L 21/02603; H01L 29/0673; H01L 29/42392; H01L 29/4908; H01L 29/66545; H01L 29/66742; H01L 29/6684; H01L 29/78696
See application file for complete search history.

(56) References Cited

U.S. PATENT DOCUMENTS 9,209,247 B2 12/2015 Colinge et al.
9,218,978 B1 * 12/2015 Ramkumar ............ H10B 43/30
(Continued)

*Primary Examiner* — Lex H Malsawma
*Assistant Examiner* — Sean Ayers Winters
(74) *Attorney, Agent, or Firm* — NZ CARR LAW OFFICE

(57) ABSTRACT

A semiconductor device structure is provided. The device includes one or more first semiconductor layers, and a dipole layer surrounding each first semiconductor layer of the one or more first semiconductor layers, wherein the dipole layer comprises germanium. The structure also includes a capping layer surrounding and in contact with the dipole layer, wherein the capping layer comprises silicon, one or more second semiconductor layers disposed adjacent the one or more first semiconductor layers. The structure further includes a gate electrode layer surrounding each first semiconductor layer of the one or more first semiconductor layers and each second semiconductor layer of the one or more second semiconductor layers.

19 Claims, 38 Drawing Sheets

(51) Int. Cl.
*H01L 29/66* (2006.01)
*H01L 21/02* (2006.01)

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2009/0302369 A1* | 12/2009 | Guha .................... H01L 29/513 257/E21.24 |
| 2017/0005169 A1* | 1/2017 | Loubet ................ H01L 27/0886 |
| 2017/0062426 A1* | 3/2017 | Loubet ............. H01L 21/02381 |
| 2019/0131415 A1* | 5/2019 | Cheng ............... H01L 29/66795 |
| 2019/0267471 A1* | 8/2019 | Chan ................ H01L 29/66795 |
| 2020/0006154 A1* | 1/2020 | Chiang ............. H01L 21/02603 |
| 2020/0105617 A1* | 4/2020 | Wang .................... H01L 29/775 |

* cited by examiner

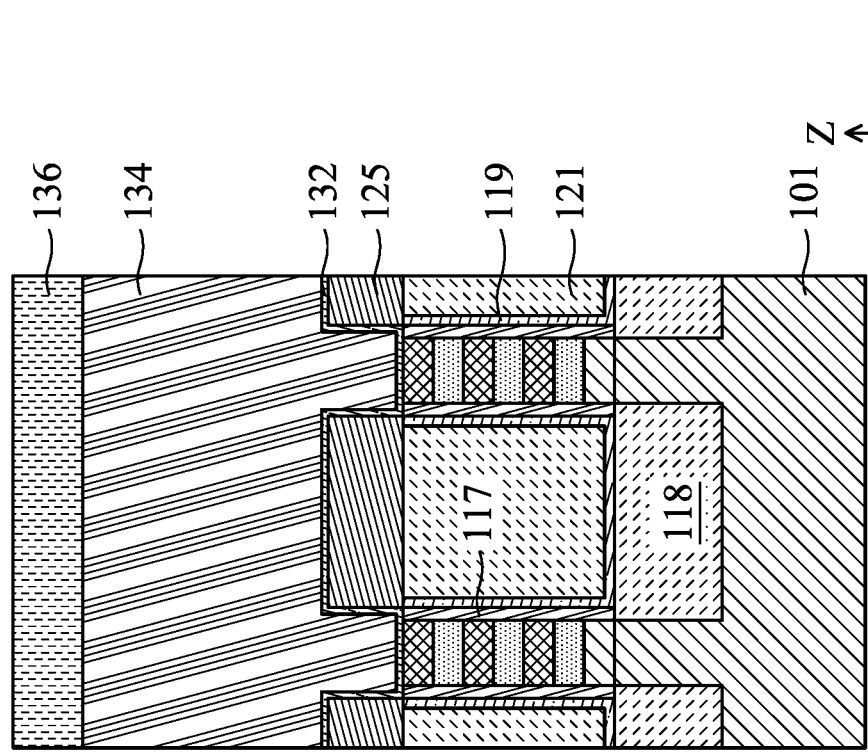
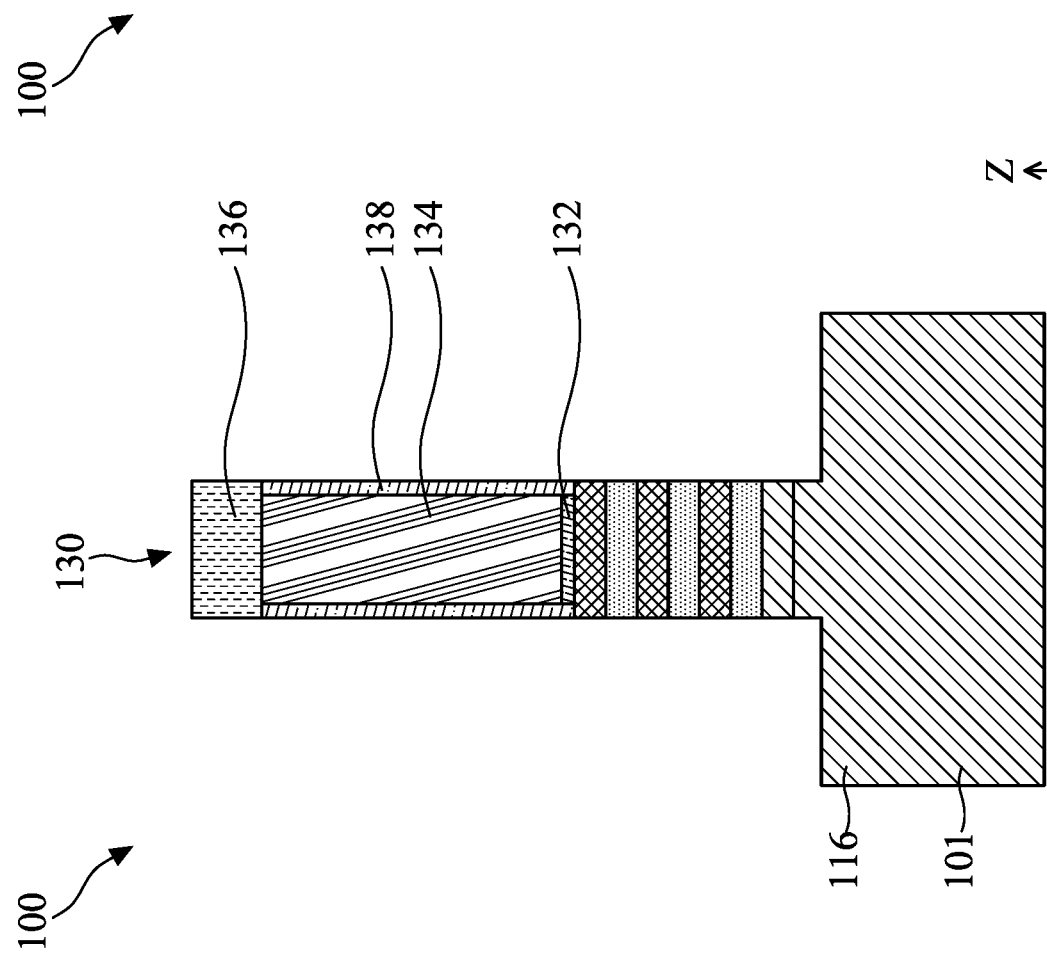
FIG. 9B
FIG. 9A

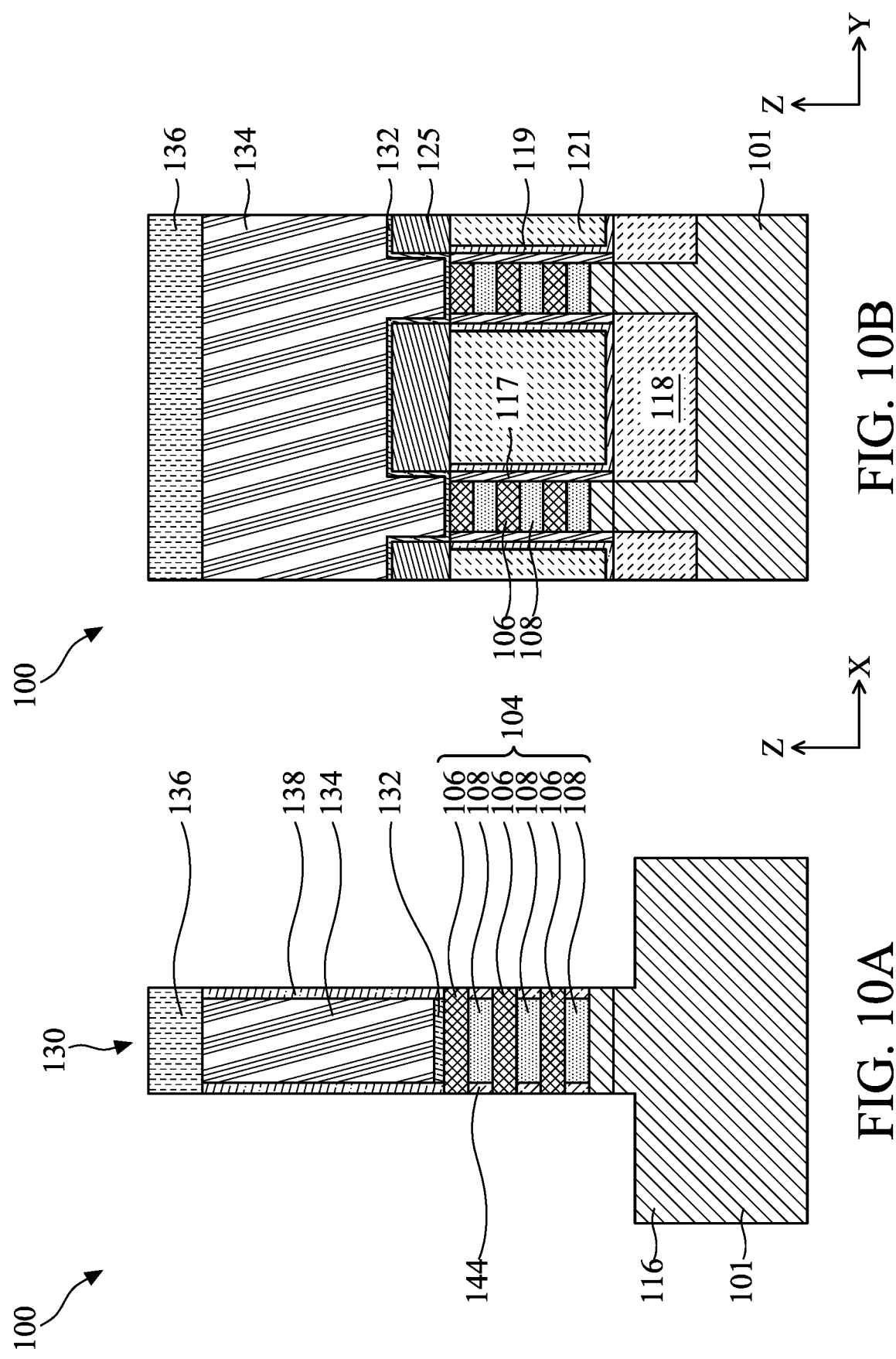

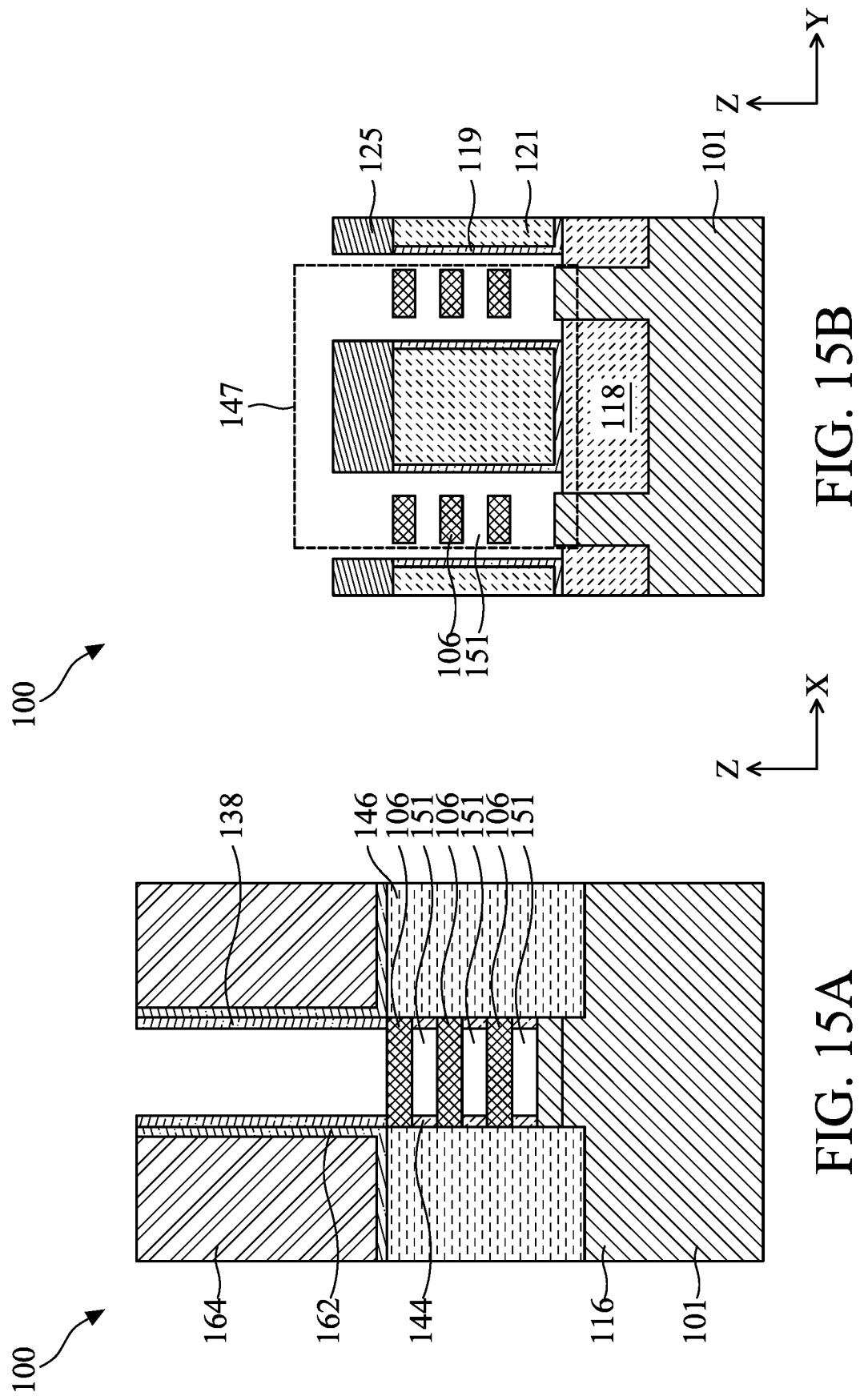

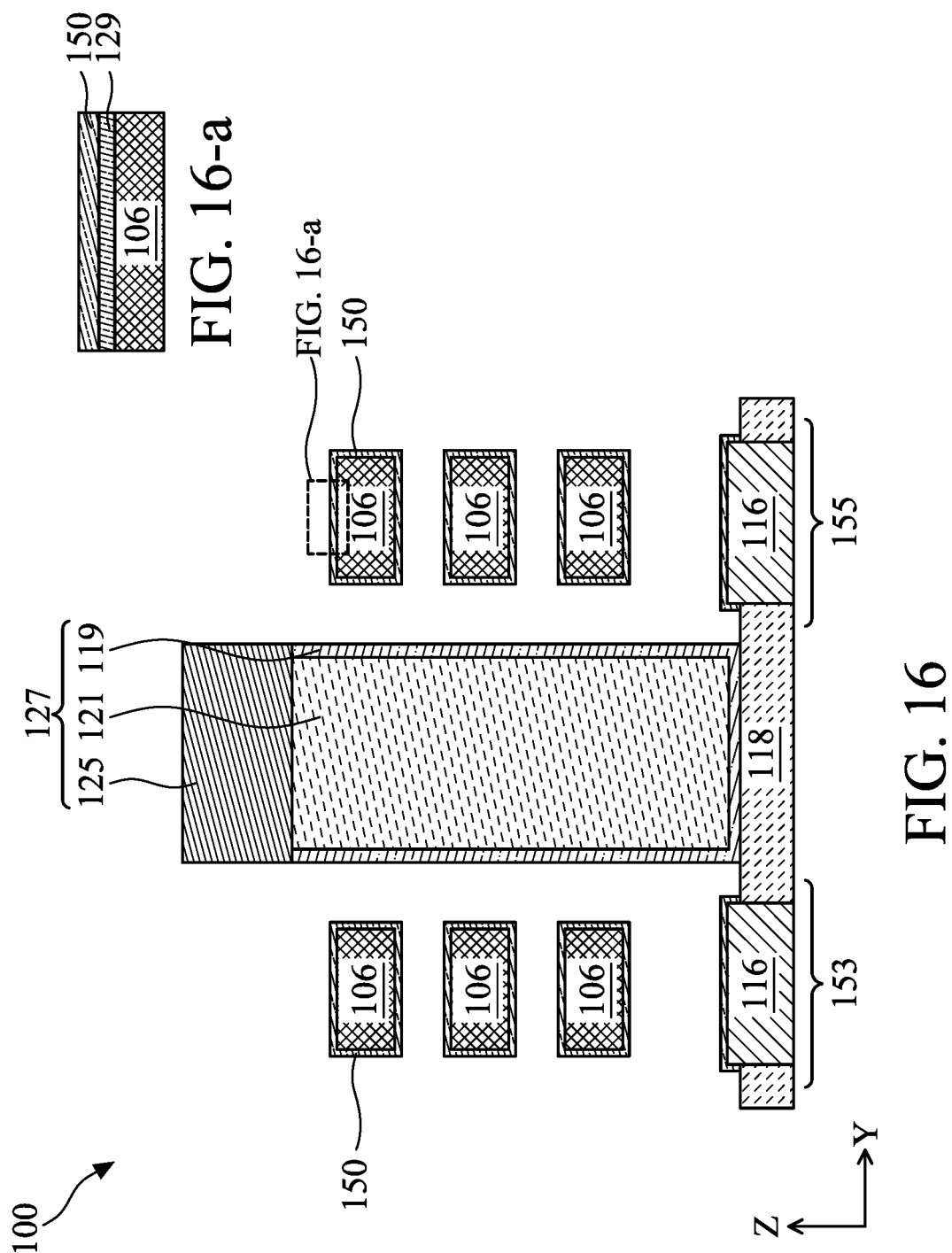

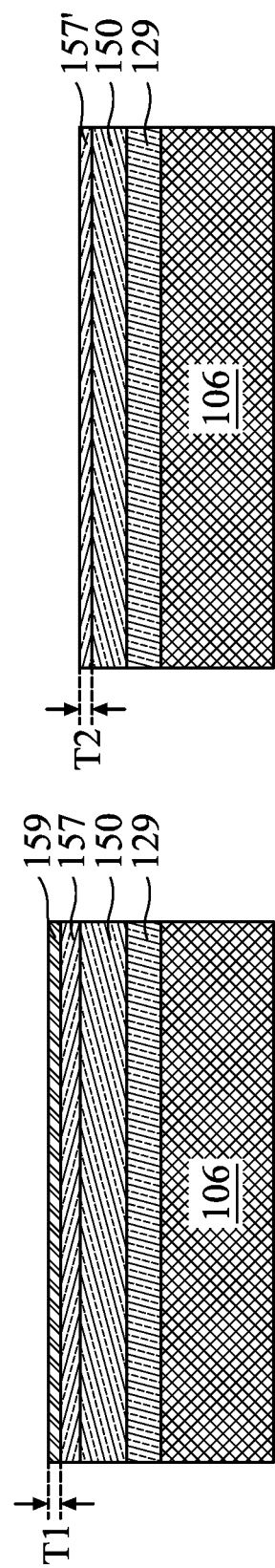

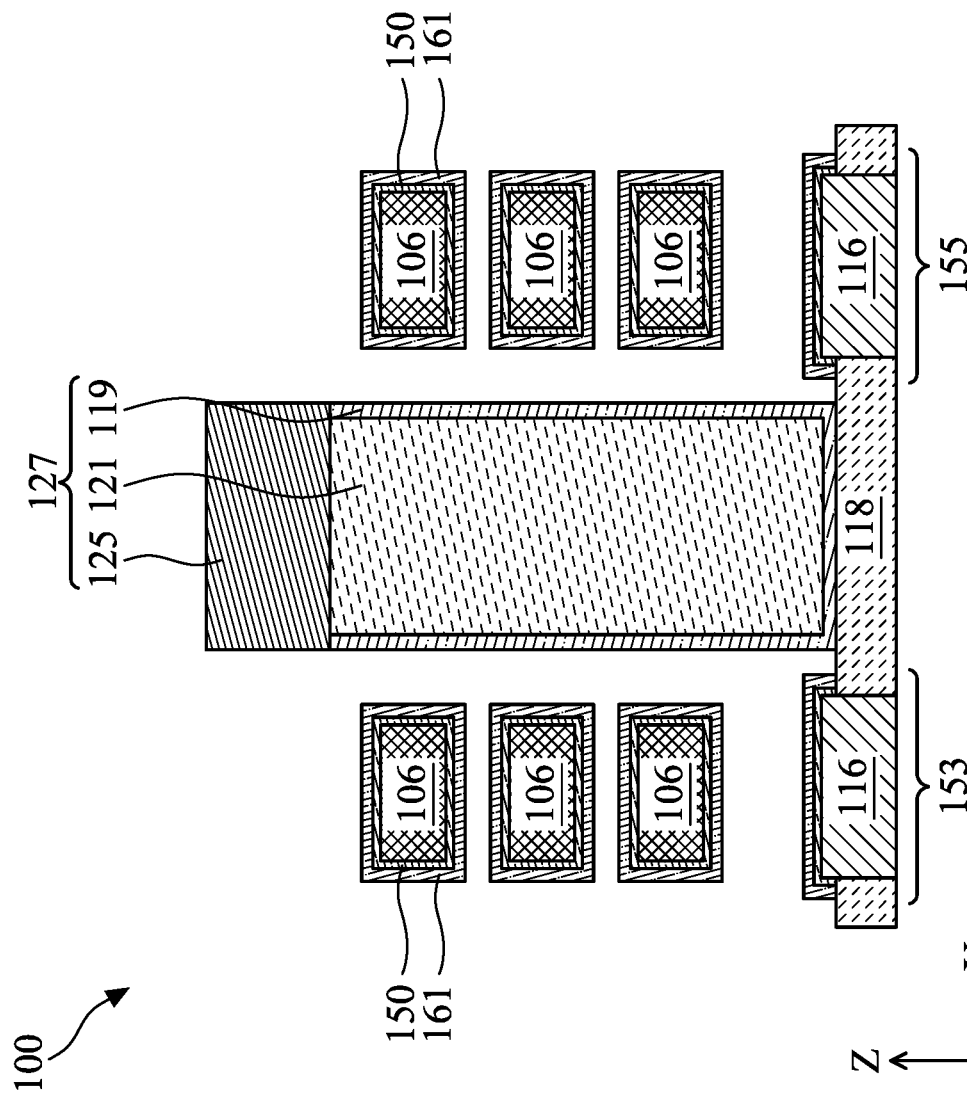
FIG. 18 (Alternative Embodiment)

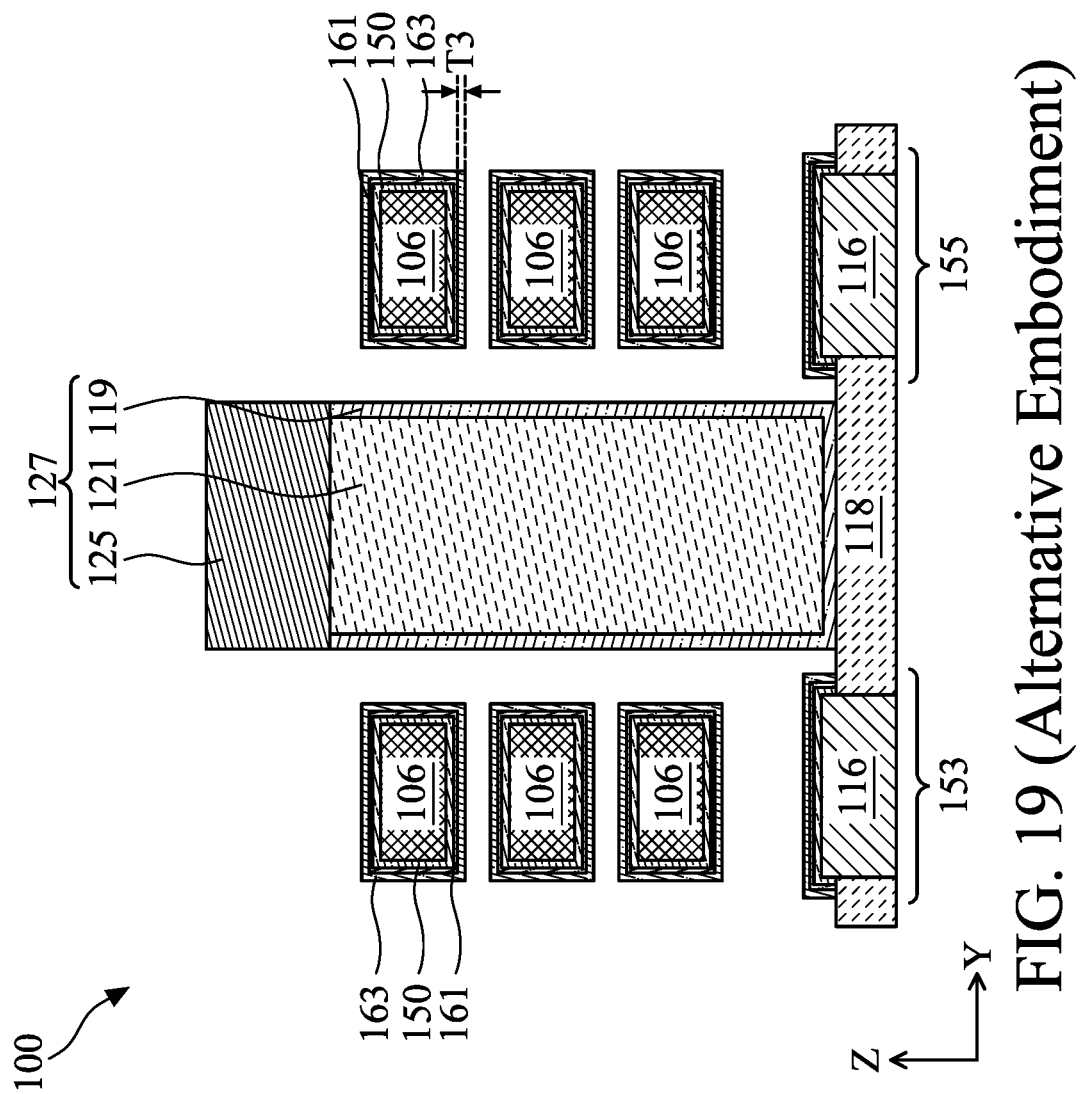
FIG. 19 (Alternative Embodiment)

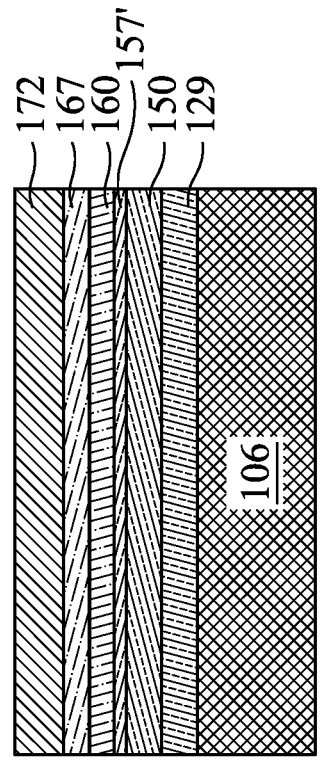
FIG. 24-b
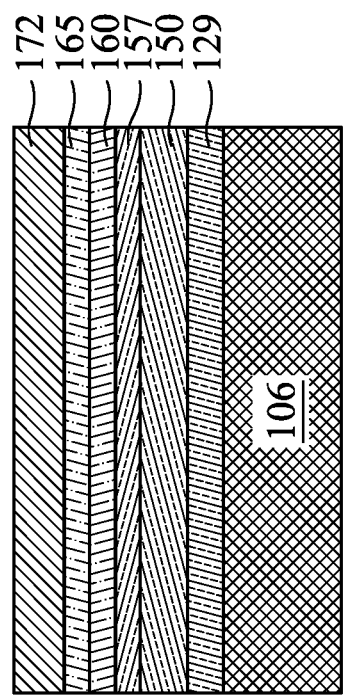
FIG. 24-a

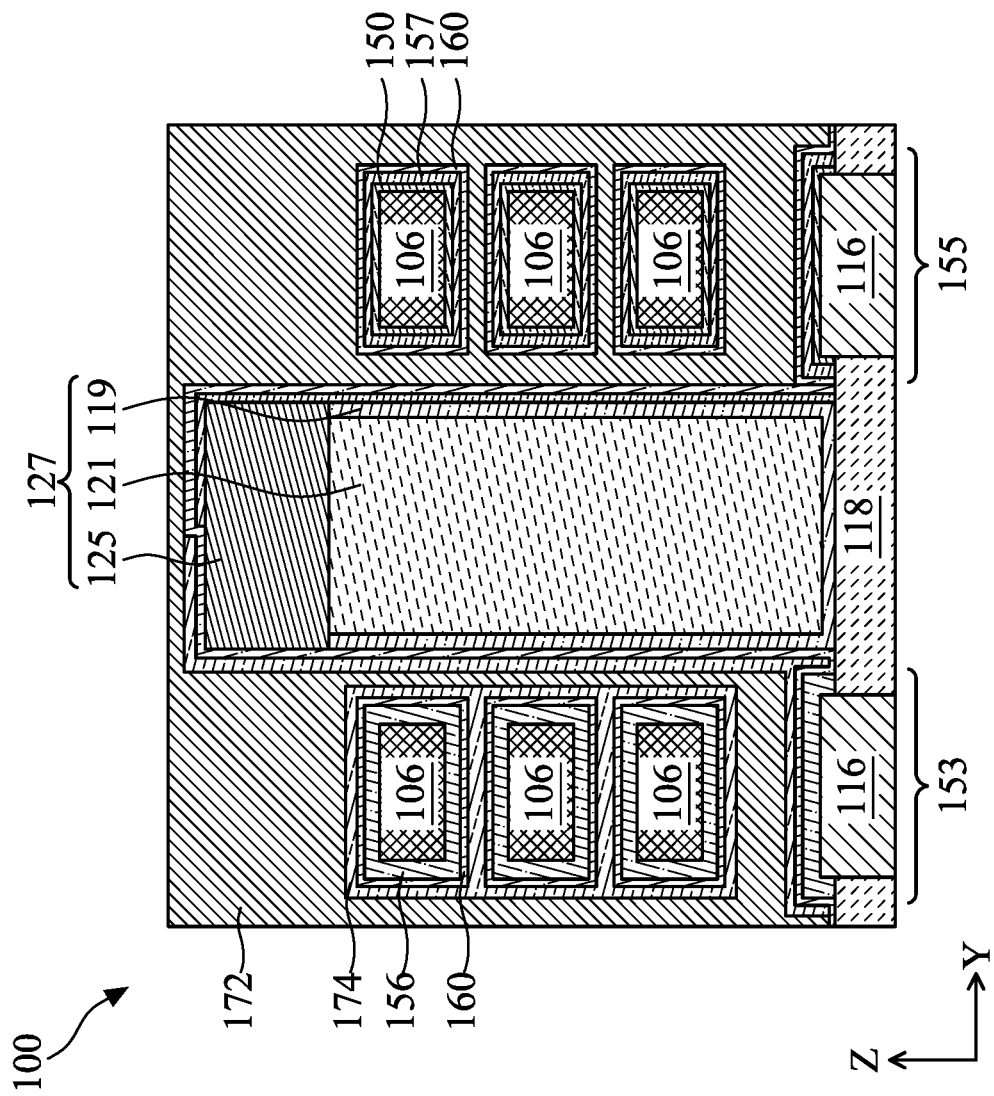
FIG. 25 (Alternative Embodiment)

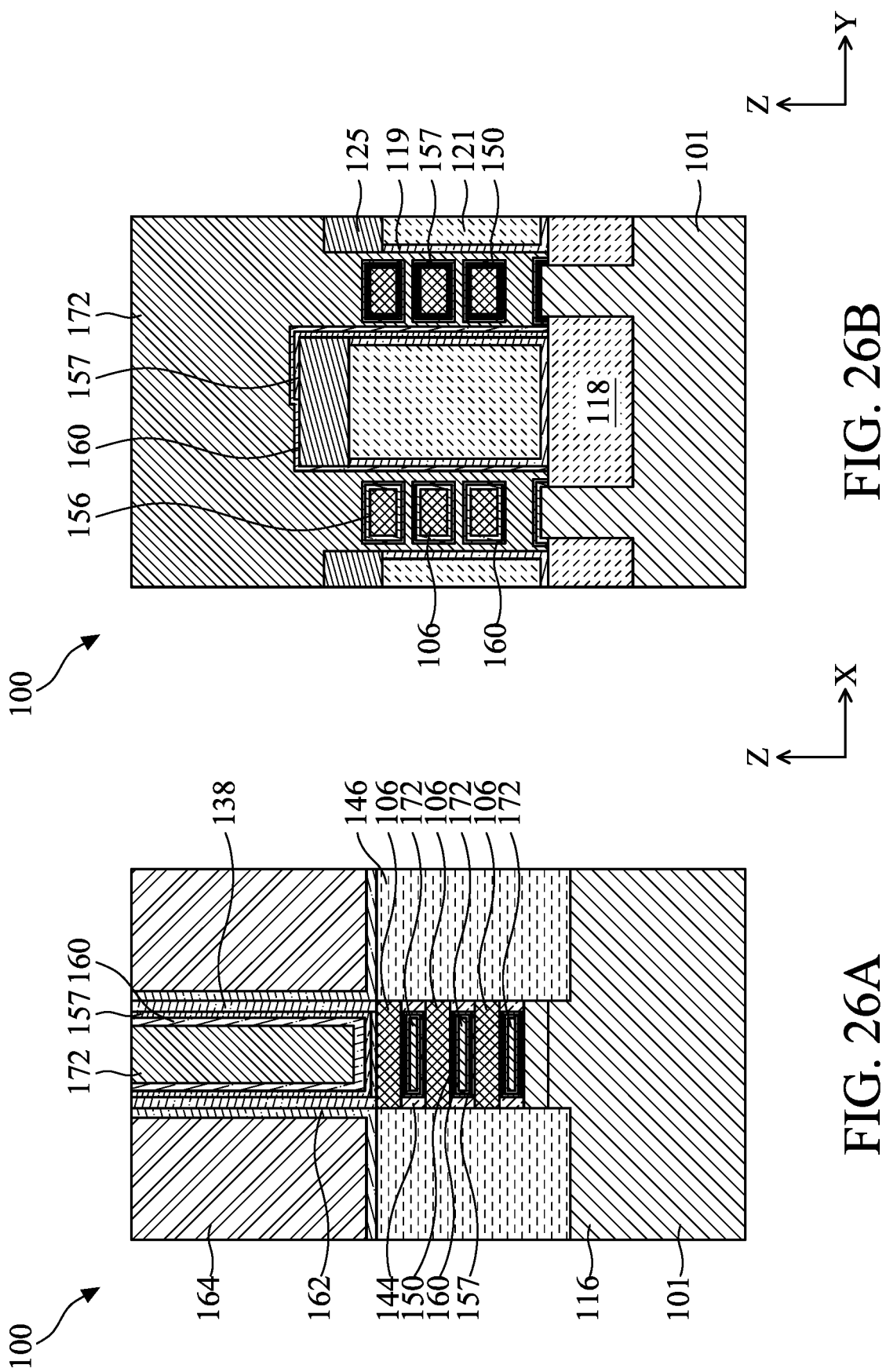

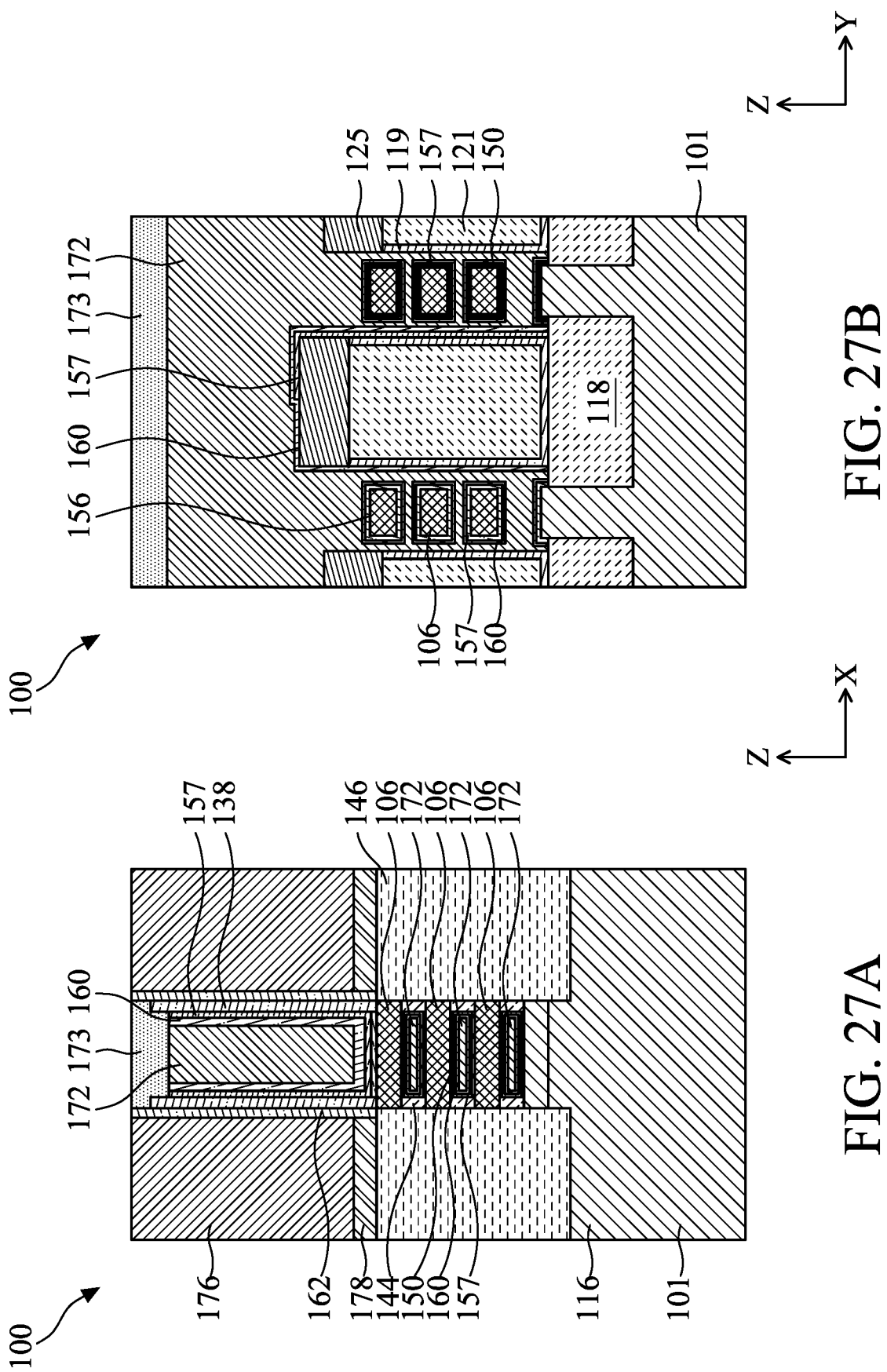

SEMICONDUCTOR DEVICE HAVING NANOSHEET TRANSISTOR AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenges.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel are surrounded by the gate electrode, which allows for fuller depletion in the channel and results in less short-channel effects and better gate control. As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-15A are cross-sectional views of one of the various stages of manufacturing the semiconductor device structure taken along cross-section A-A of FIG. 8, in accordance with some embodiments.

FIGS. 9B-15B are cross-sectional side views of the semiconductor device structure taken along cross-section B-B of FIG. 8, in accordance with some embodiments.

FIGS. 9C-15C are cross-sectional views of one of the various stages of manufacturing the semiconductor device structure taken along cross-section C-C of FIG. 8, in accordance with some embodiments.

FIGS. 16-25 are enlarged views of a region of FIG. 15B showing various stages of manufacturing the semiconductor device structure in accordance with some embodiments.

FIGS. 26A-26D and 27A-27D are cross-sectional views of one of the various stages of manufacturing the semiconductor device structure taken along cross-sections A-A, B-B, C-C, and D-D of FIG. 8, in accordance with some embodiments.

DETAILED DESCRIPTION

Figure 1:
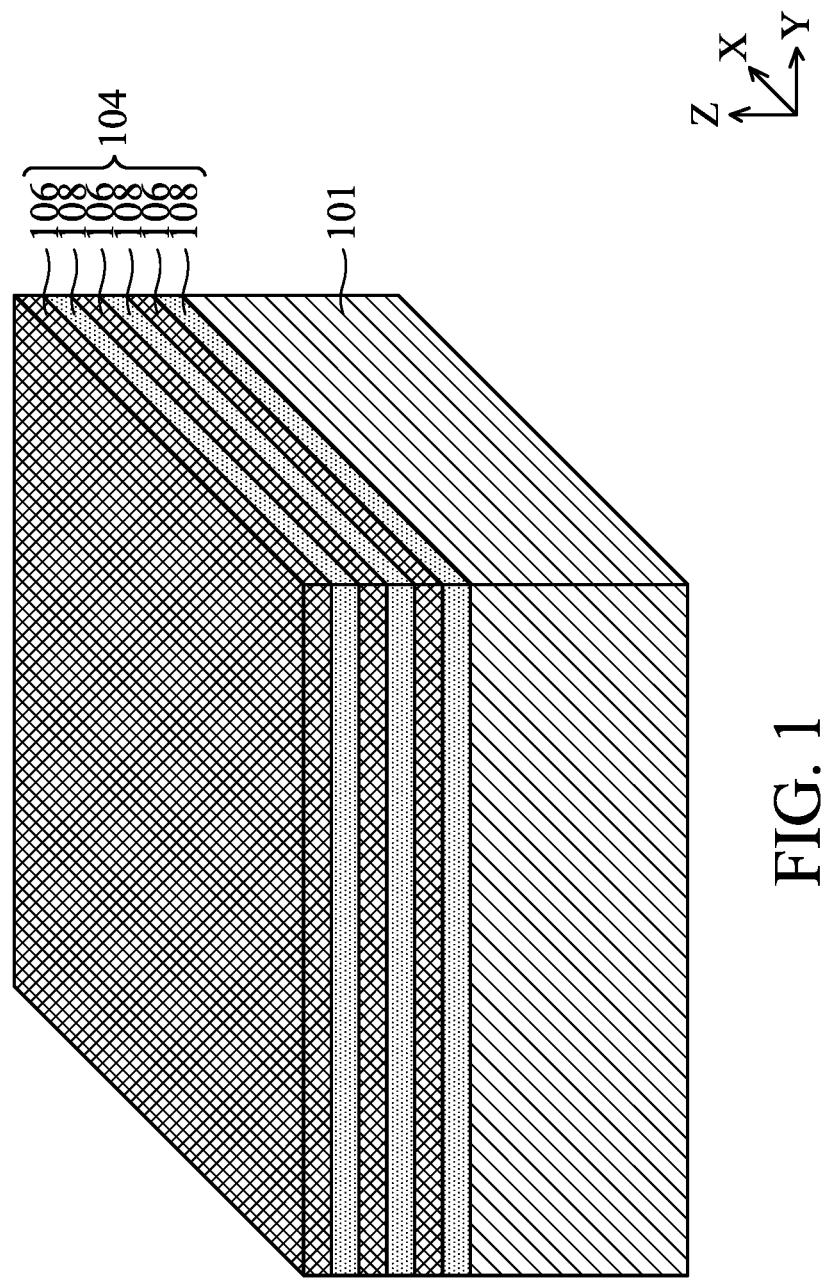
FIGS. 1-8 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-27D show exemplary processes for manufacturing a semiconductor device structure 100 according to embodiments of the present disclosure. It is understood that additional operations can be provided before, during, and after processes shown by FIGS. 1-27D, and some of the operations described below can be replaced or eliminated, for additional embodiments of the method. The order of the operations/processes is not limiting and may be interchangeable.

FIGS. 1-8 are perspective views of various stages of manufacturing a semiconductor device structure 100 in accordance with some embodiments. As shown in FIG. 1, a semiconductor device structure 100 includes a stack of semiconductor layers 104 formed over a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example boron for n-type field effect transistors (n-type FETs) and phosphorus for p-type field effect transistors (p-type FETs).

The stack of semiconductor layers 104 includes semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layer 106 and the second semiconductor layer 108 may vary depending on the application and/or device performance considerations. In some embodiments, each first and second semiconductor layer 106, 108 has a thickness in a range between about 5 nm and about 30 nm. In other embodiments, each first and second semiconductor layer 106, 108 has a thickness in a range between about 10 nm and about 20 nm. In some embodiments, each first and second semiconductor layer 106, 108 has a thickness in a range between about 6 nm and about 12 nm. Each second semiconductor layer 108 may have a thickness that is equal, less, or greater than the thickness of the first semiconductor layer 106. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels needed for each FET of the semiconductor device structure 100. For example, the number of first semiconductor layers 106, which is the number of channels, may be between 2 and 8.

Figure 2:
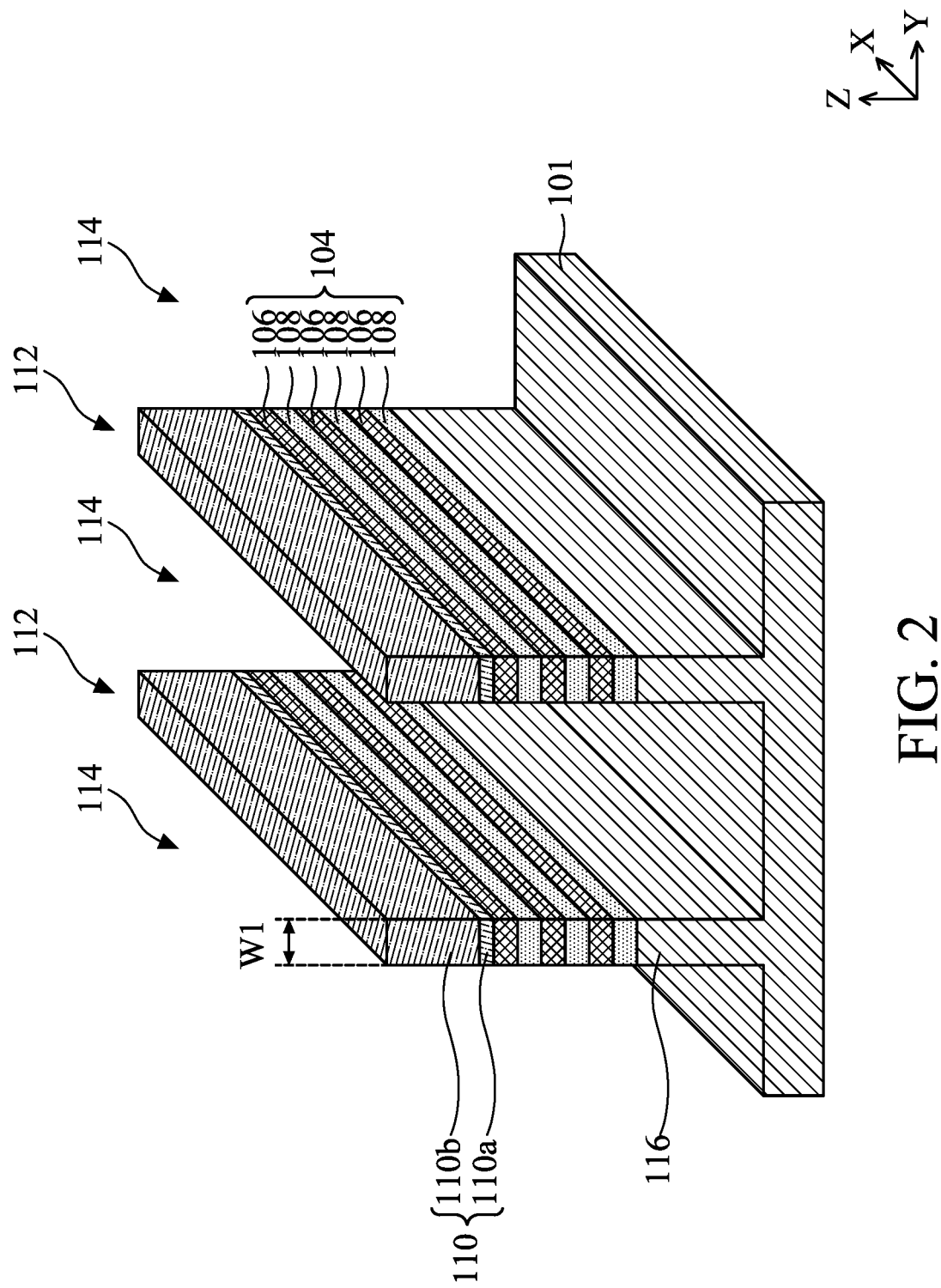

In FIG. 2, fin structures 112 are formed from the stack of semiconductor layers 104. Each fin structure 112 has an upper portion including the semiconductor layers 106, 108, a well portion 116 formed from the substrate 101, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer, such as a $SiO_2$ layer, or a nitrogen-containing layer, such as $Si_3N_4$. The mask structure 110 may be formed by any suitable deposition process, such as chemical vapor deposition (CVD) process.

The fin structures 112 may be fabricated using suitable processes including photolithography and etch processes. In some embodiments, the photolithography process may include forming a photoresist layer (not shown) over the mask structure 110, exposing the resist to a pattern, performing post-exposure bake processes, and developing the resist to form a patterned resist. The patterned resist may then be used to protect regions of the substrate 101, and layers formed thereupon, while an etch process forms trenches 114 in unprotected regions through the mask structure 110, the stack of semiconductor layers 104, and into the substrate 101, thereby leaving the extending fin structures 112. A width W1 of the fin structures 112 along the Y direction is in a range between about 3 nm and about 44 nm. In some embodiments, the width W1 of the fin structures 112 along the Y direction is in a range between about 20 nm and about 30 nm. The trenches 114 may be etched using a dry etch (e.g., RIE), a wet etch, and/or combination thereof. While two fin structures 112 are shown, the number of the fin structures is not limited to two.

Figure 3:
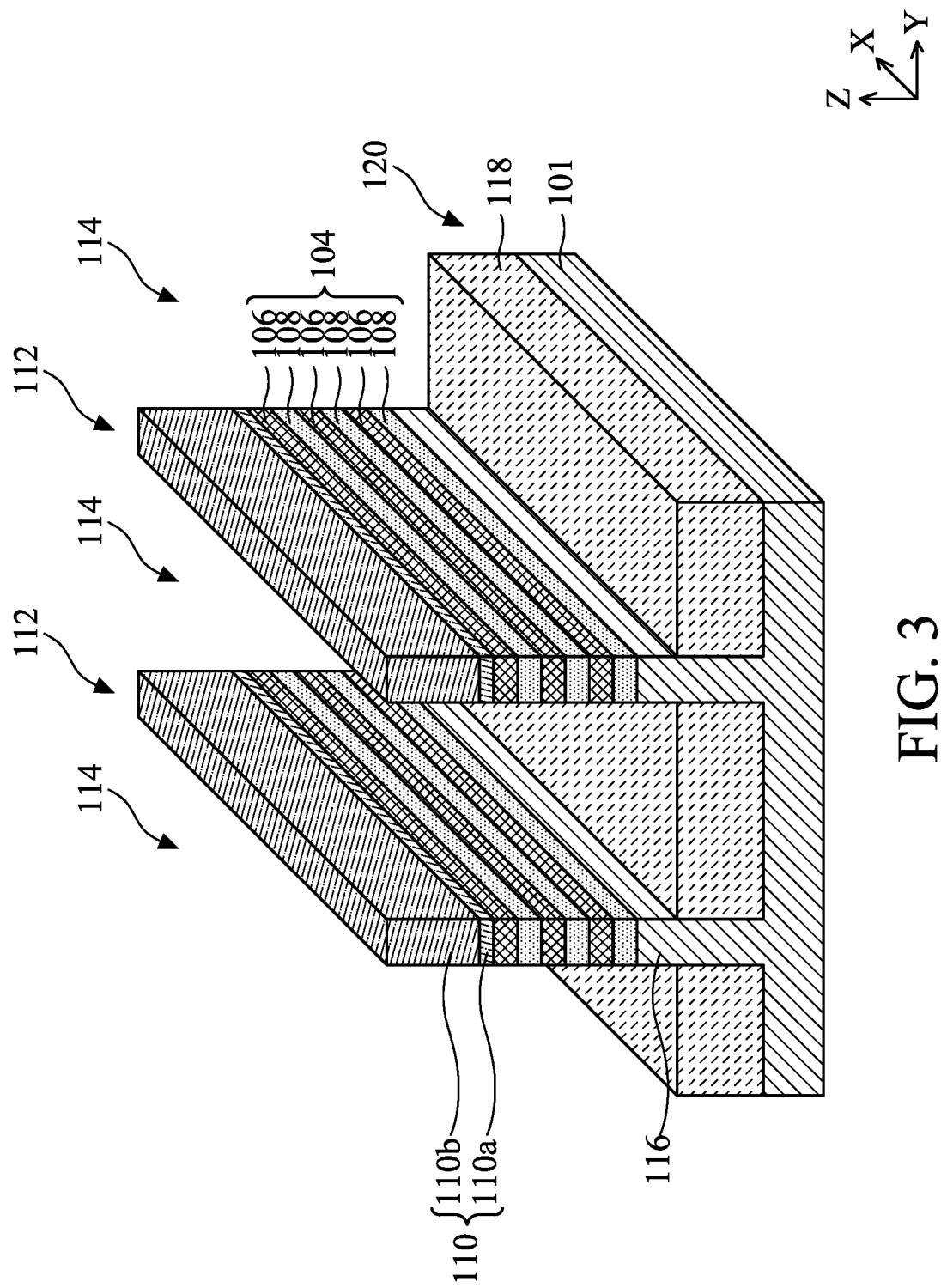

In FIG. 3, after the fin structures 112 are formed, an insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed to expose the top of the fin structures 112. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116.

Figure 4:
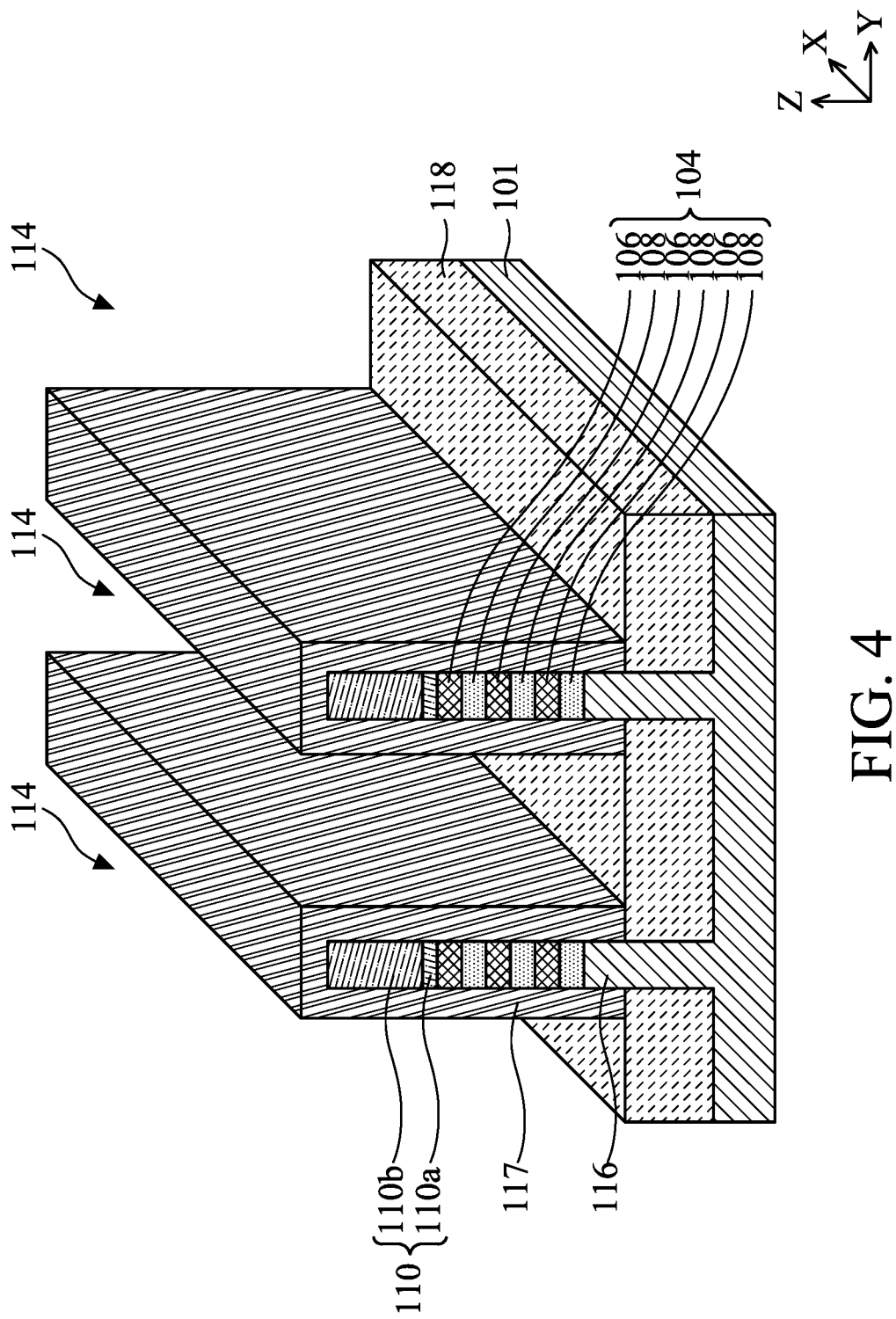

In FIG. 4, a cladding layer 117 is formed by an epitaxial process over exposed portion of the fin structures 112. In some embodiments, a semiconductor liner (not shown) may be first formed over the fin structures 112, and the cladding layer 117 is then formed over the semiconductor liner. The semiconductor liner may be diffused into the cladding layer 117 during the formation of the cladding layer 117. In either case, the cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 may be removed subsequently to create space for the gate electrode layer.

Figure 5:
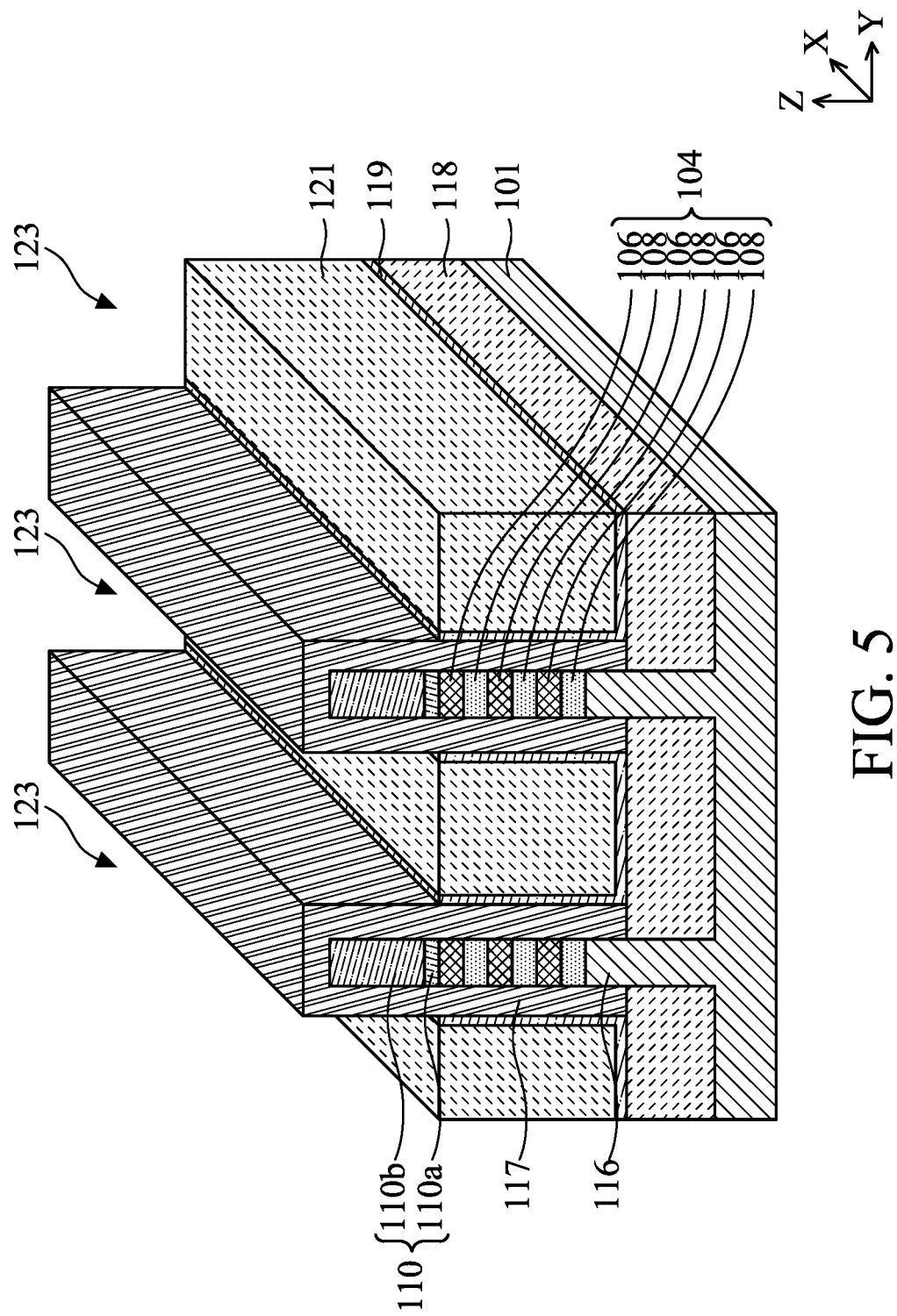

In FIG. 5, a liner 119 is formed on the cladding layer 117 and the top surface of the insulating material 118. The liner 119 may include a low-k dielectric material (e.g., a material having a k value lower than 7), such as $SiO_2$, SiN, SiCN, SiOC, or SiOCN. The liner 119 may be formed by a conformal process, such as an ALD process. A dielectric material 121 is then formed in the trenches 114 (FIG. 4) and on the liner 119. The dielectric material 121 may be an oxygen-containing material, such as an oxide, formed by FCVD. The oxygen-containing material may have a K value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Next, the liner 119 and the dielectric material 121 are recessed using any suitable process to the level of the topmost first semiconductor layer 106. For example, in some embodiments, after the recess process, the top surfaces of the liner 119 and the dielectric material 121 may be recessed to level with a top surface of the topmost first semiconductor layer 106. The etch processes may be selective etch processes that do not remove the semiconductor material of the cladding layer 117. As a result of the recess process, trenches 123 are formed between the fin structures 112.

Figure 6:
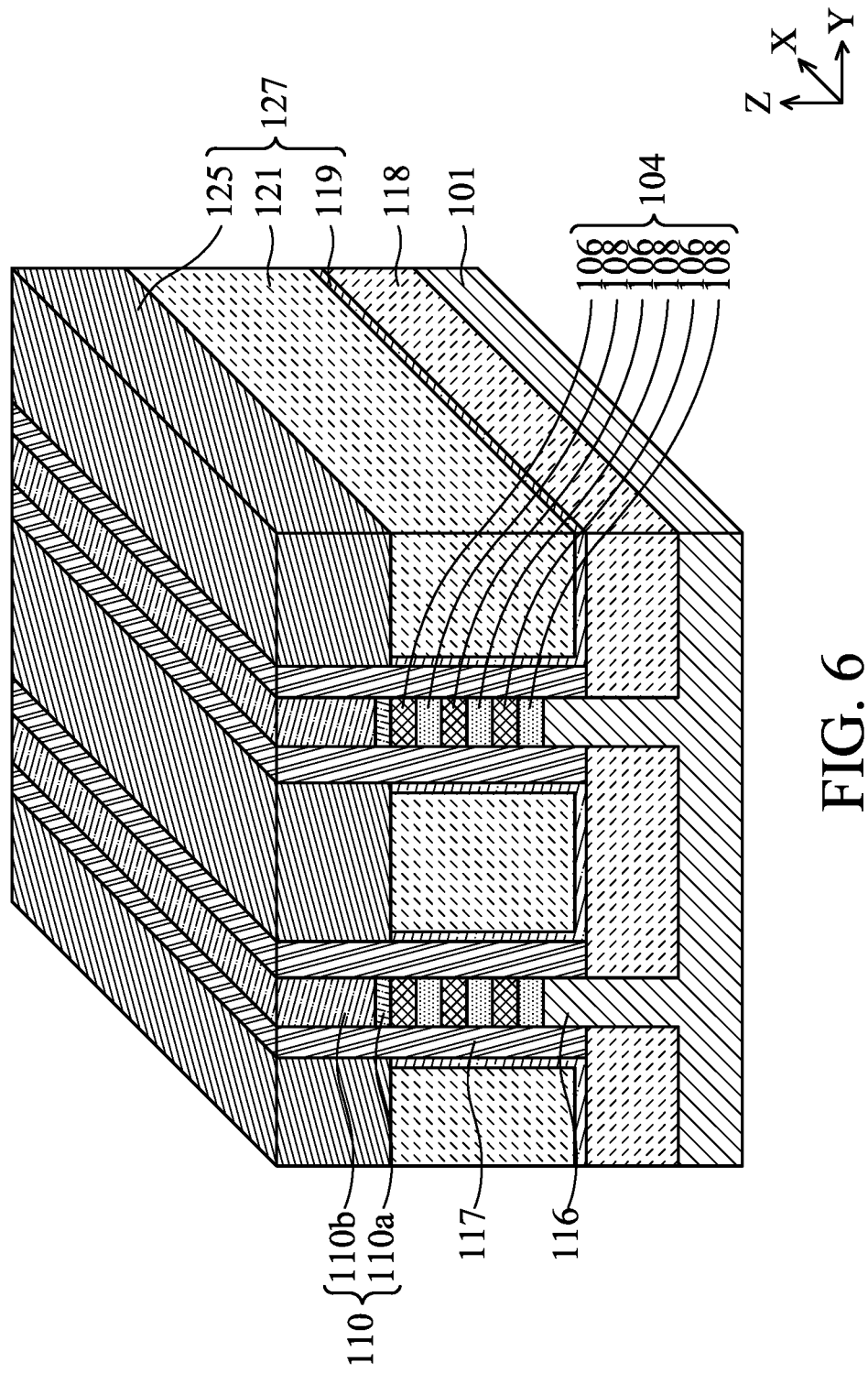

In FIG. 6, a dielectric material 125 is formed in the trenches 123 (FIG. 5) and on the dielectric material 121 and the liner 119. The dielectric material 125 may include SiO, SiN, SiC, SiCN, SiON, SiOCN, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110b of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves as a dielectric fin that separates subsequent source/drain (S/D) epitaxial features and adjacent gate electrode layers.

Figure 7:
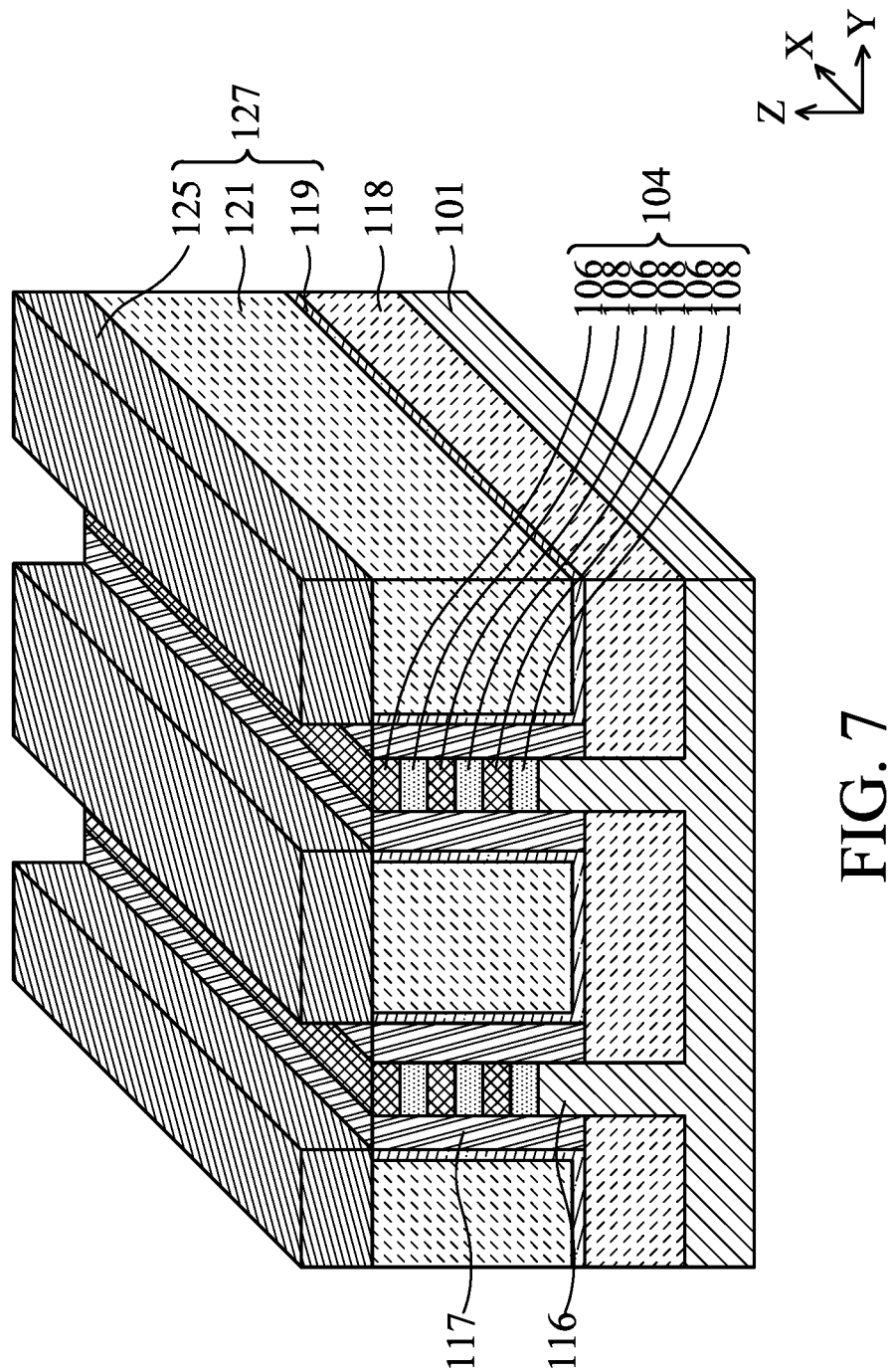

In FIG. 7, the cladding layers 117 are recessed, and the mask structures 110 are removed. The recess of the cladding layers 117 may be performed by any suitable process, such as dry etch, wet etch, or a combination thereof. The recess process may be controlled so that the remaining cladding layers 117 are substantially at the same level as the top surface of the topmost first semiconductor layer 106 in the stack of semiconductor layers 104. The recess process may be a selective etch process that does not remove the dielectric material 125. The removal of the mask structures 110 may be performed by any suitable process, such as dry etch, wet etch, or a combination thereof.

Figure 8:
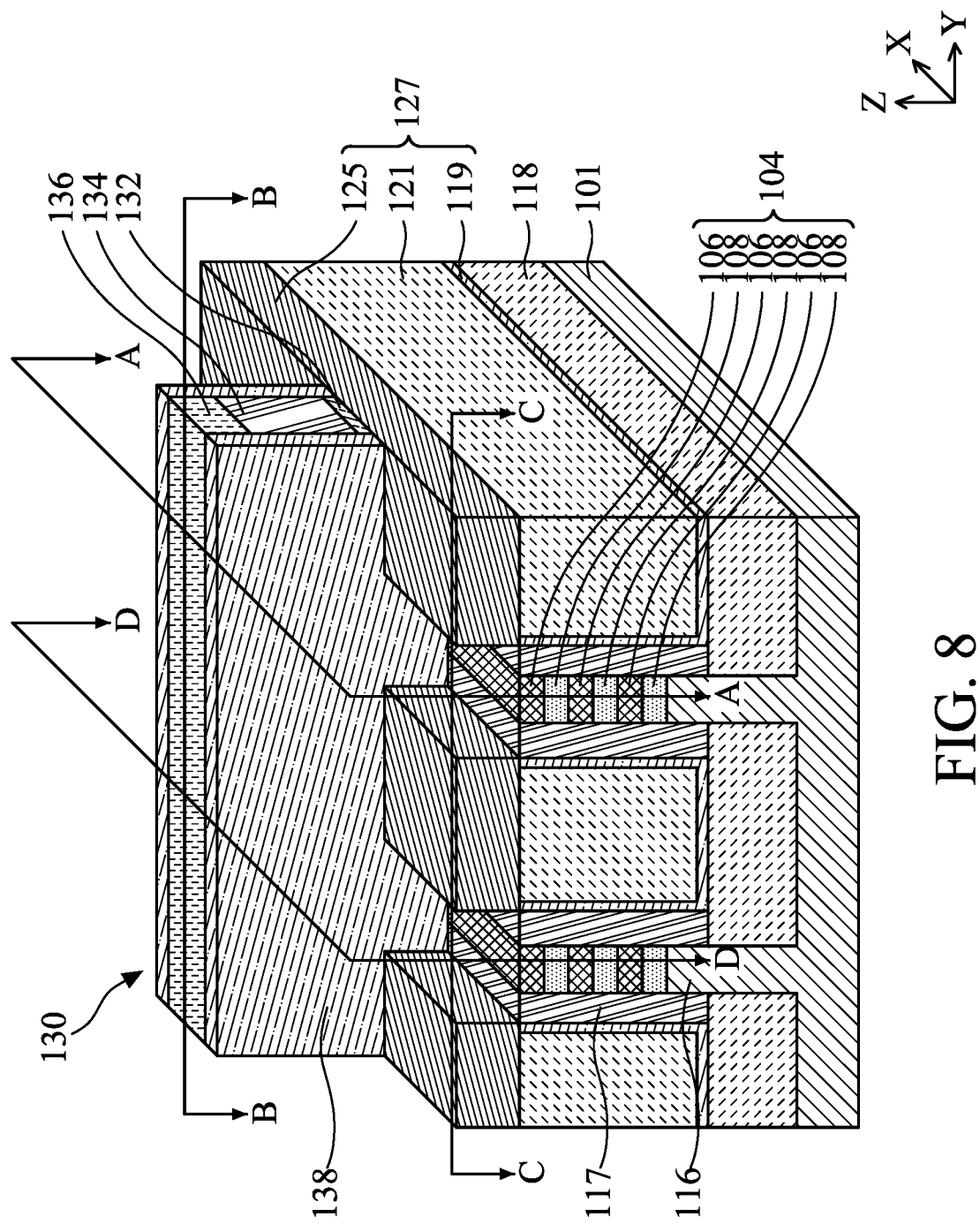

In FIG. 8, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While one sacrificial gate structure 130 is shown, two or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

FIGS. 9A-15A are cross-sectional views of one of the various stages of manufacturing the semiconductor device structure 100 taken along cross-section A-A of FIG. 8, in accordance with some embodiments. FIGS. 9B-15B are cross-sectional side views of the semiconductor device structure 100 taken along cross-section B-B of FIG. 8, in accordance with some embodiments. FIGS. 9C-15C are cross-sectional views of one of the various stages of manufacturing the semiconductor device structure 100 taken along cross-section C-C of FIG. 8, in accordance with some embodiments. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the epitaxial S/D features 146 (FIG. 11C) along the Y-direction.

Figure 9C:
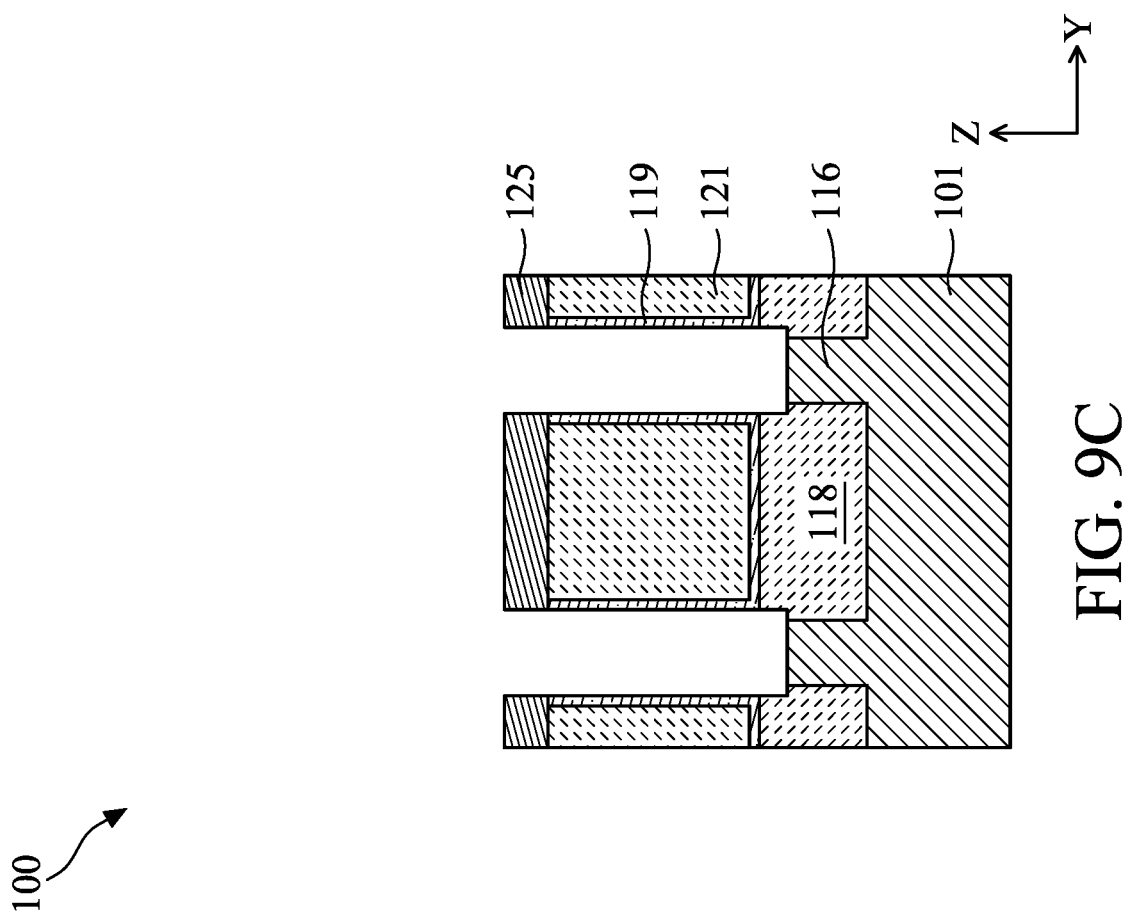

In FIGS. 9A-9C, exposed portions of the fin structures 112, exposed portions of the cladding layers 117, and exposed portions of the dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 9A, the exposed portions of the fin structures 112 are recessed to a level at or slightly below the bottom surface of the second semiconductor layer 108 in contact with the well portion 116 of the substrate 101. The recess processes may include an etch process that recesses the exposed portions of the fin structures 112 and the exposed portions of the cladding layers 117.

Figure 10C:
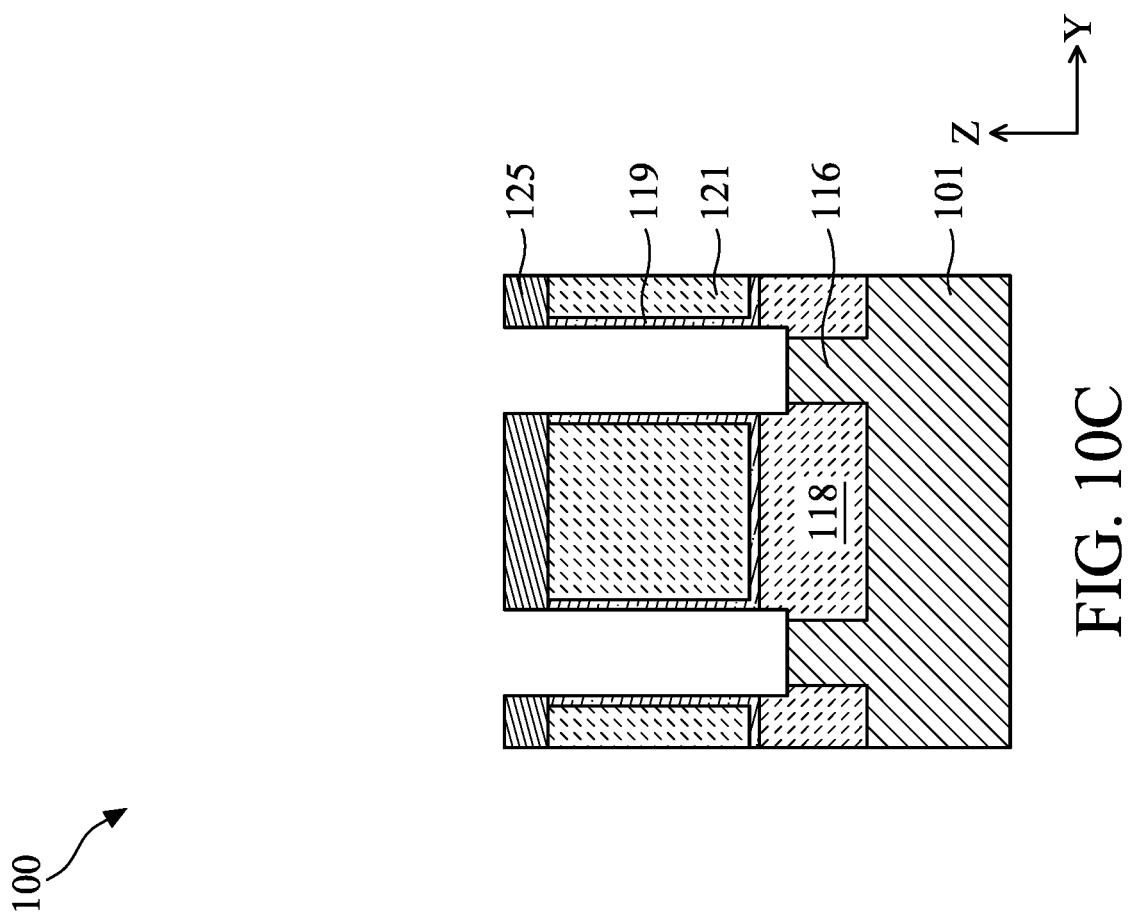

In FIGS. 10A-10C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figures 11A, 11B:
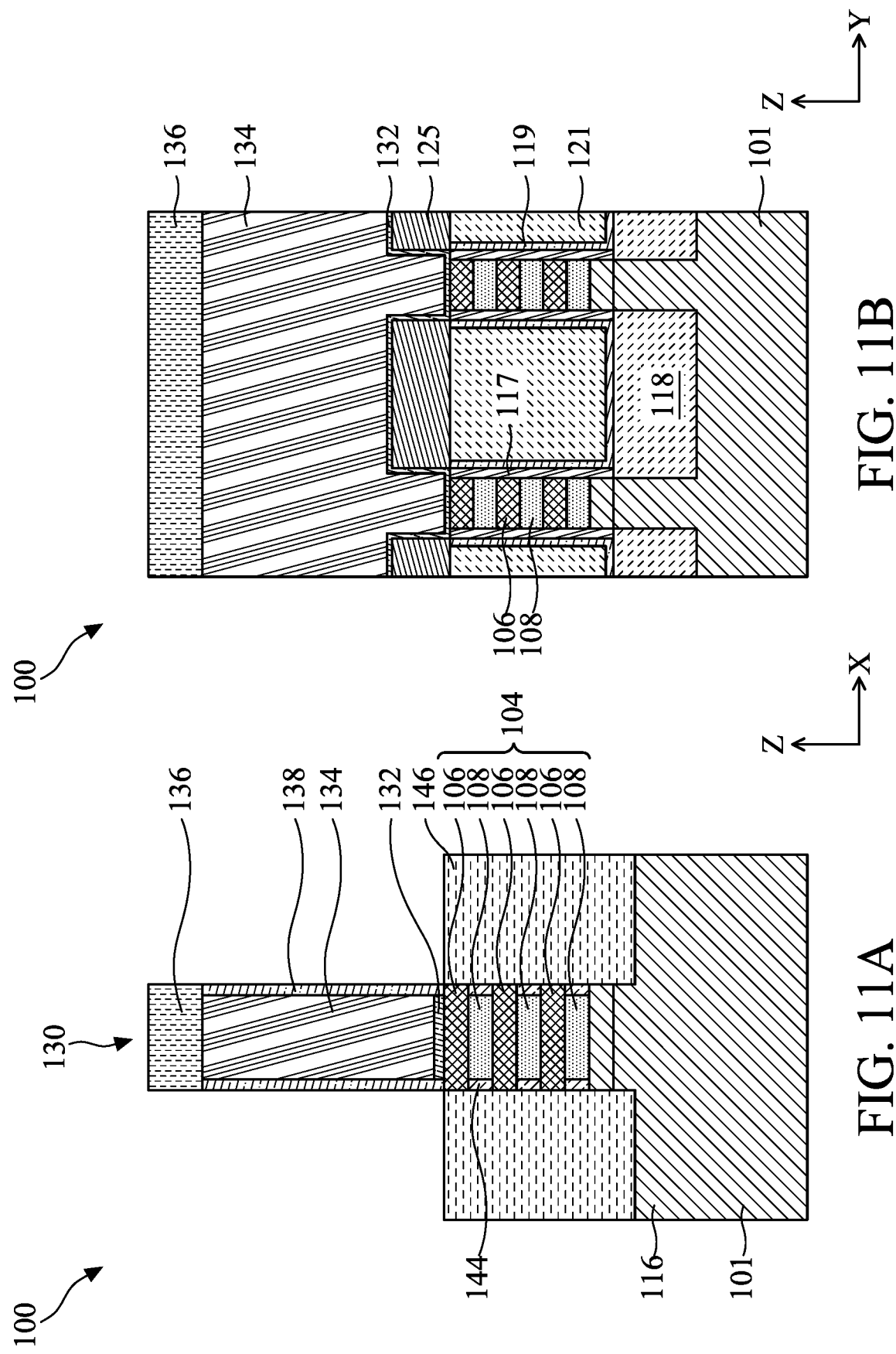
Figure 11C:
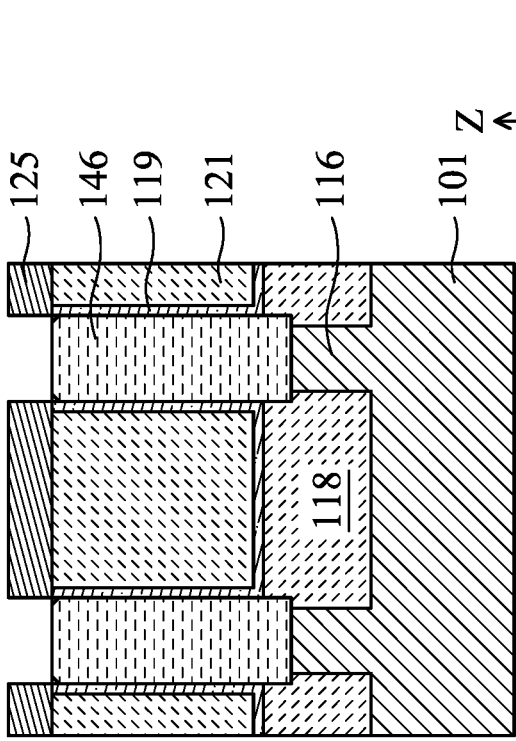

In FIGS. 11A-11C, epitaxial S/D features 146 are formed on the well portion 116 of the fin structures 112. The epitaxial S/D feature 146 may include one or more layers of Si, SiP, SiC and SiCP for an n-type FET or Si, SiGe, Ge for a p-type FET. The epitaxial S/D features 146 may grow both vertically and horizontally to form facets, which may correspond to crystalline planes of the material used for the substrate 101. The epitaxial S/D features 146 are formed by an epitaxial growth method using CVD, ALD or MBE. The epitaxial S/D features 146 are in contact with the first semiconductor layers 106 and dielectric spacers 144. The epitaxial S/D features 146 may be the S/D regions. For example, one of a pair of epitaxial S/D features 146 located on one side of the sacrificial gate structures 130 can be a source region, and the other of the pair of epitaxial S/D features 146 located on the other side of the sacrificial gate structures 130 can be a drain region. A pair of epitaxial S/D features 146 includes a source epitaxial feature 146 and a drain epitaxial feature 146 connected by the channels (i.e., the first semiconductor layers 106). In this disclosure, a source and a drain are interchangeably used, and the structures thereof are substantially the same.

Figures 12A, 12B:
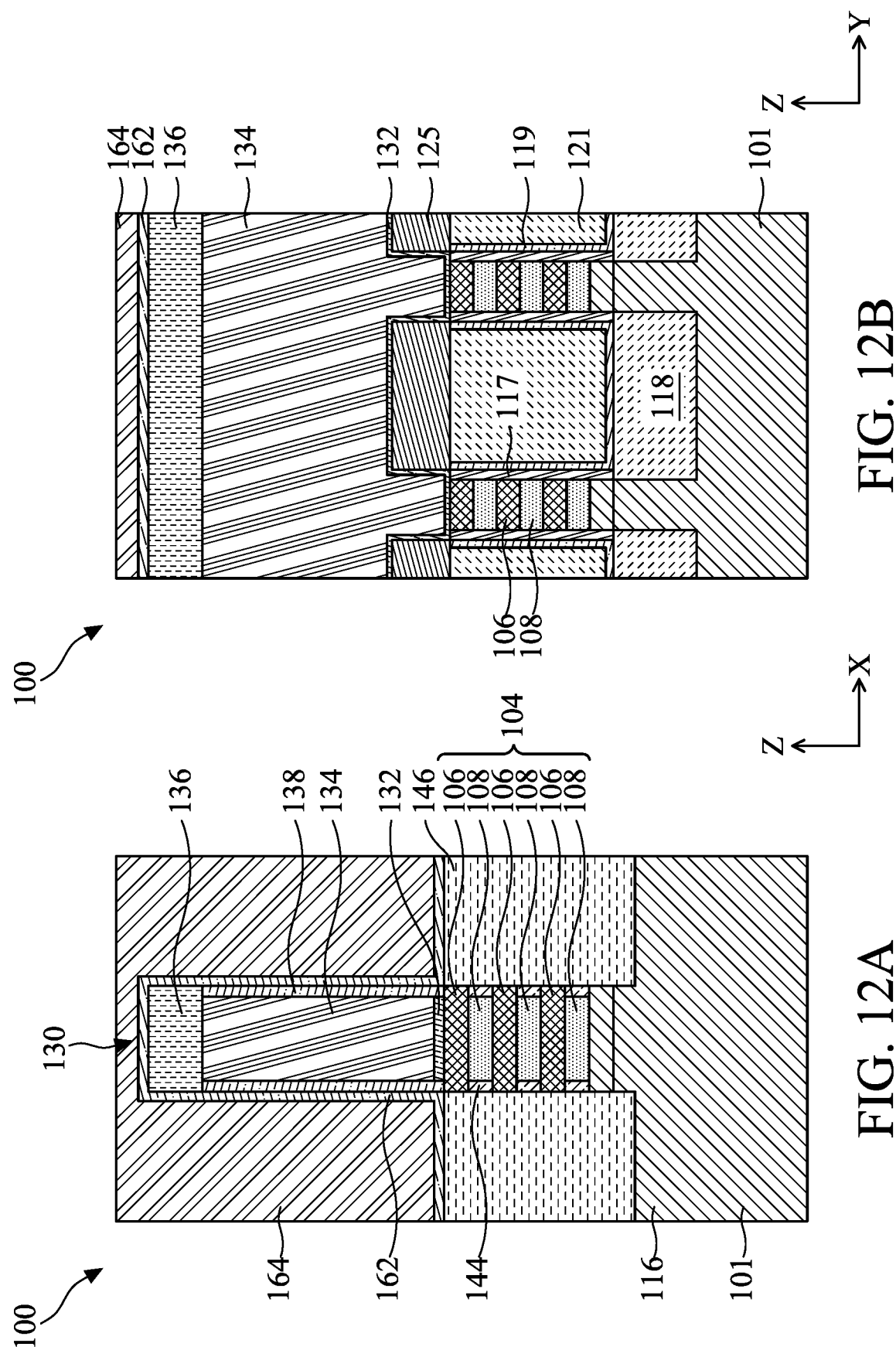
Figure 12C:
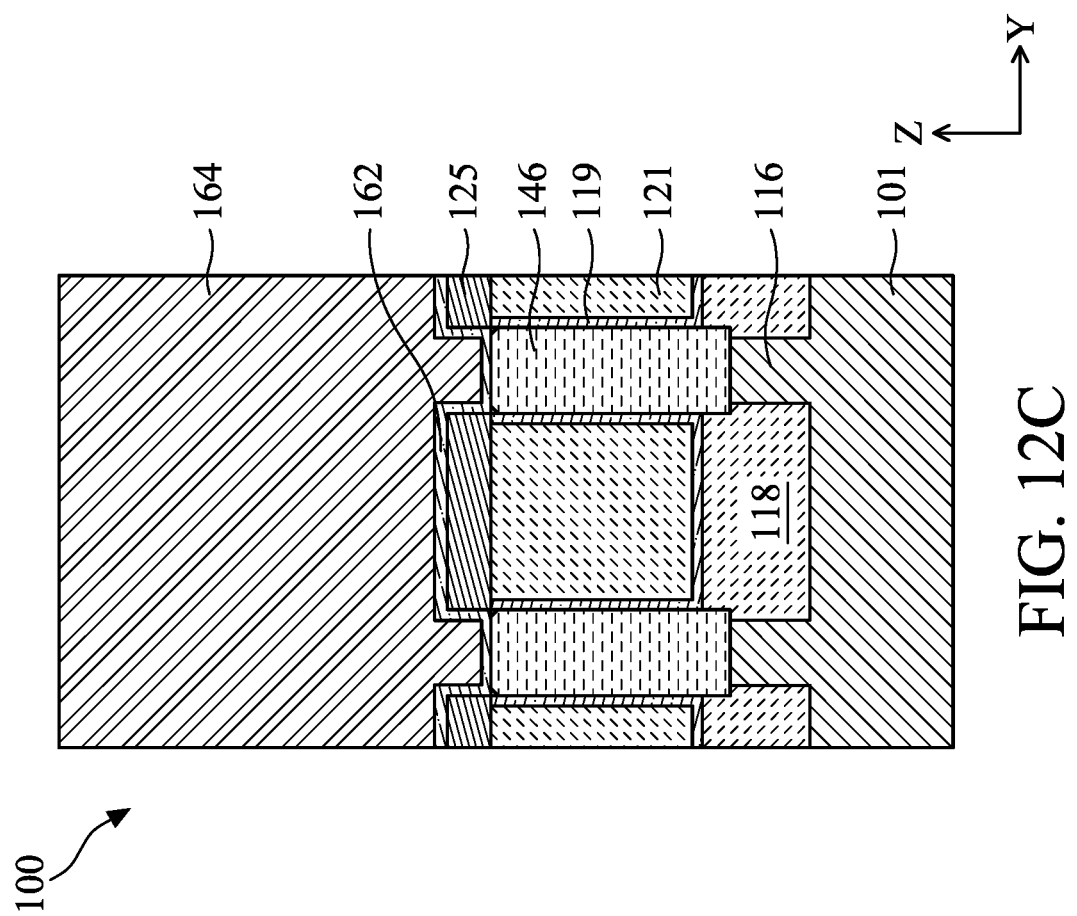

In FIGS. 12A-12C, after formation of the epitaxial S/D features 146, a contact etch stop layer (CESL) 162 is conformally formed on the exposed surfaces of the semiconductor device structure 100. The CESL 162 covers the epitaxial S/D features 146, the gate spacers 138, the dielectric material 125, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figures 13A, 13B:
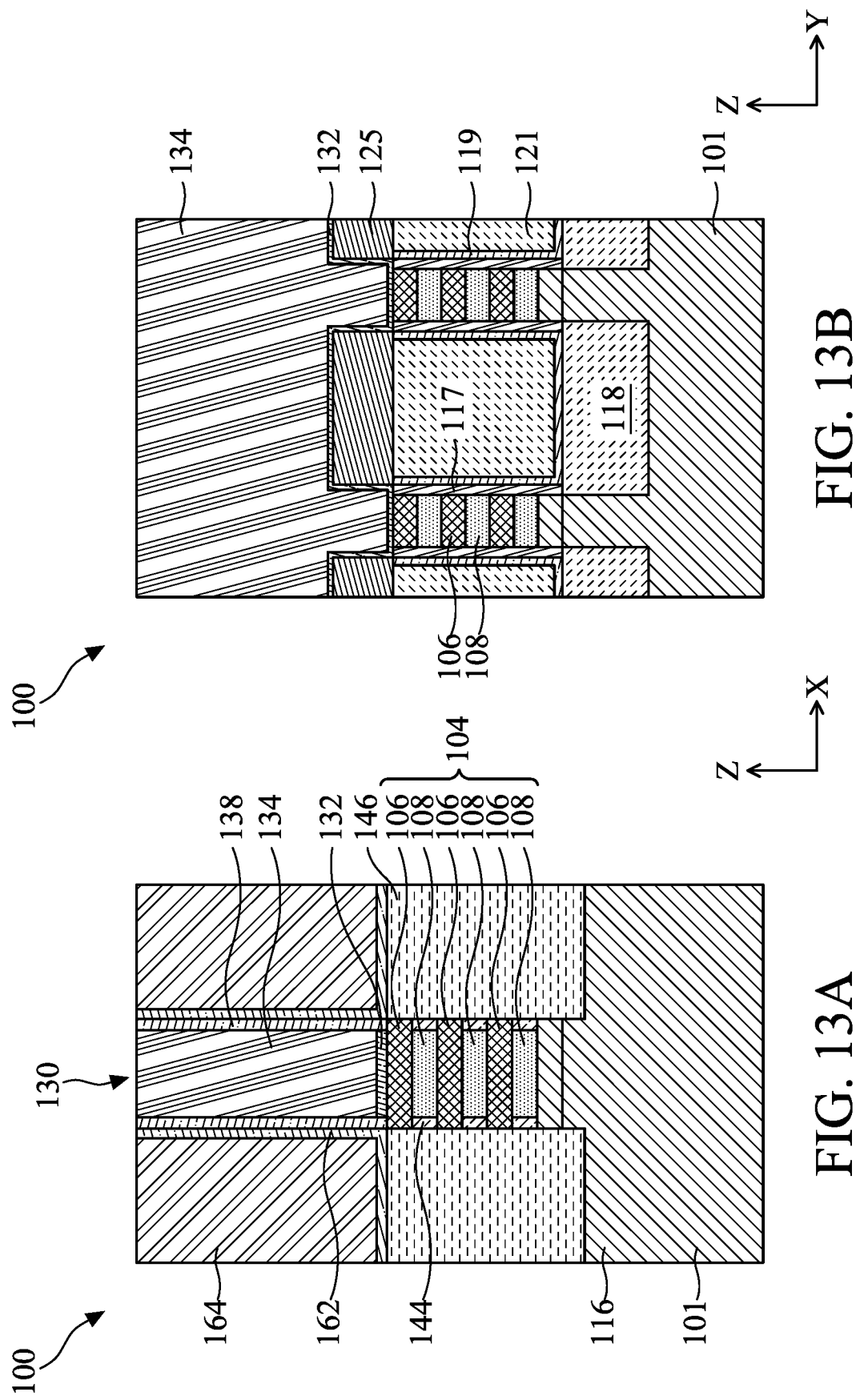
Figure 13C:
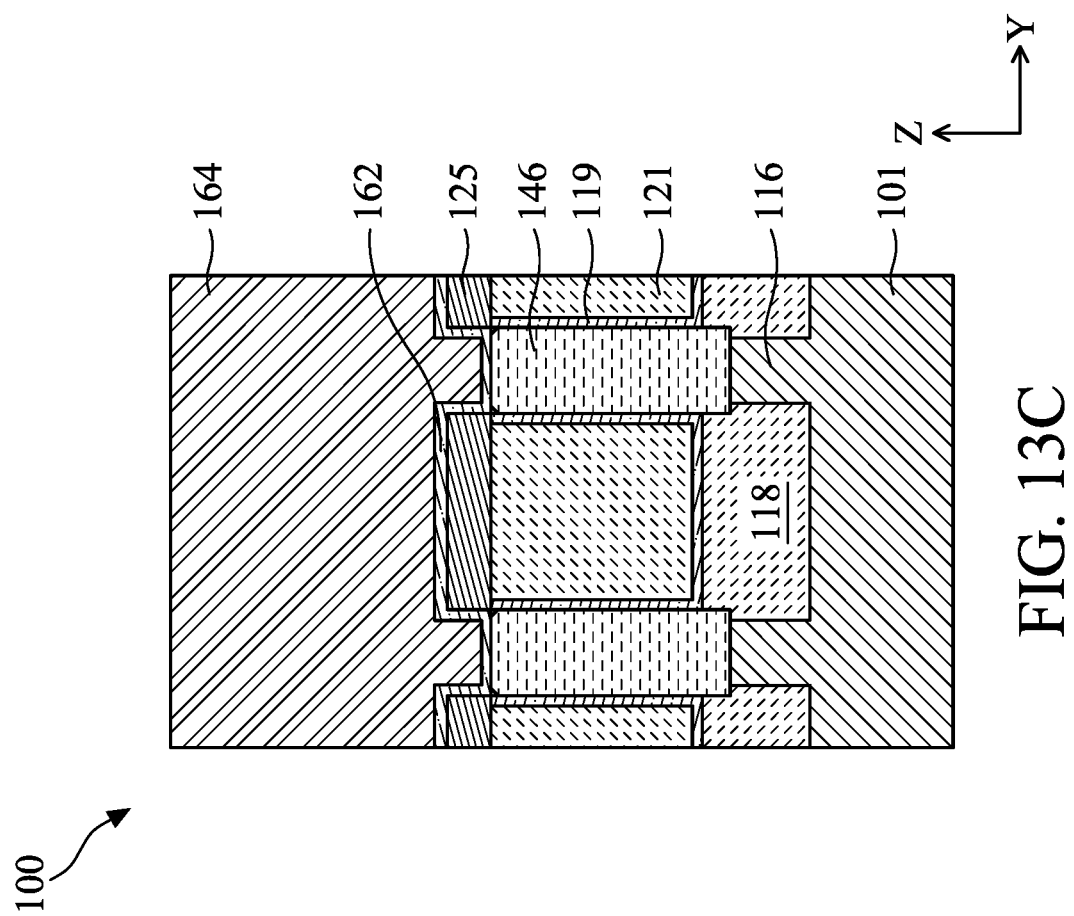

In FIGS. 13A-13C, after the ILD layer 164 is formed, a planarization operation, such as CMP, is performed on the semiconductor device structure 100 to remove portions of the ILD layer 164, the CESL 162 and the mask layer 136 until the sacrificial gate electrode layer 134 is exposed.

Figures 14A, 14B:
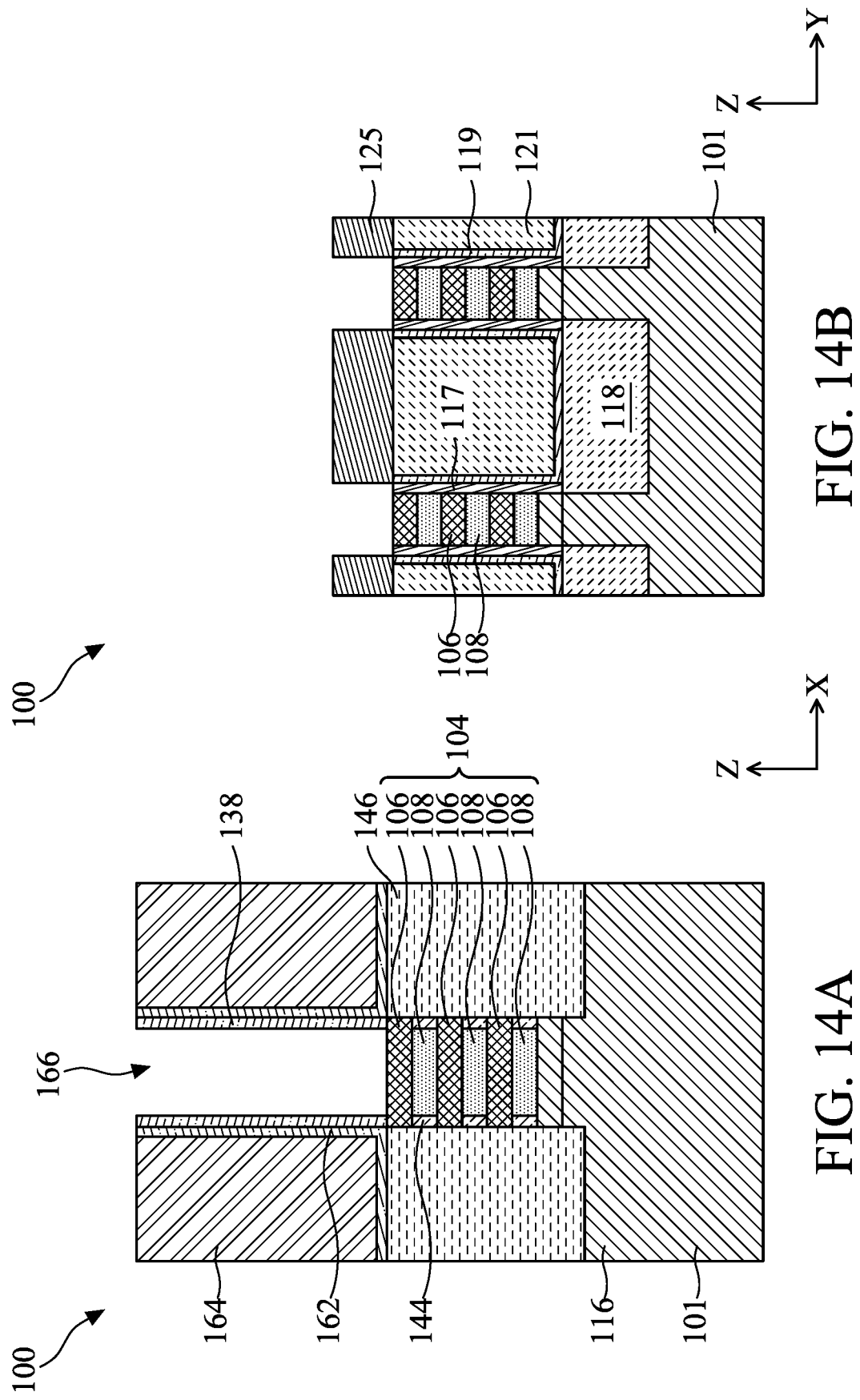
Figure 14C:
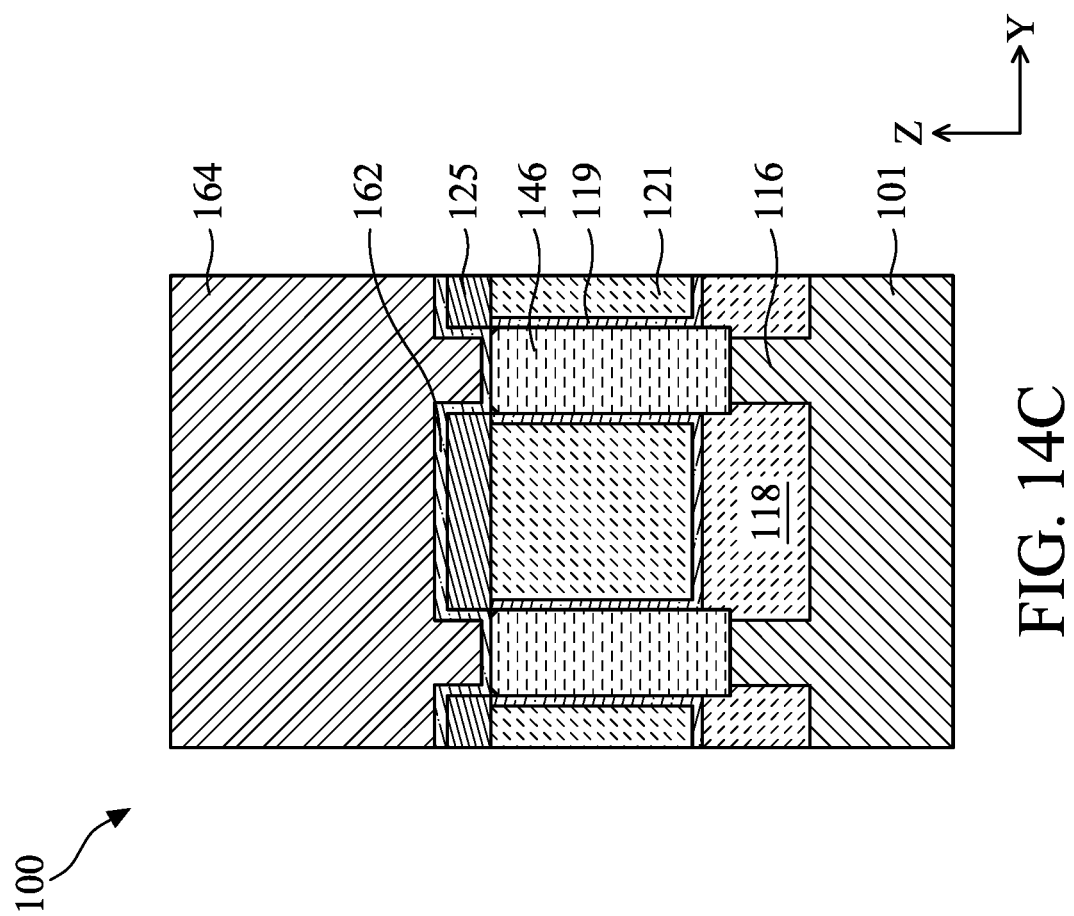

In FIGS. 14A-14C, the sacrificial gate structure 130 is removed. The removal of the sacrificial gate structure 130 forms a trench 166 in the regions where the sacrificial gate electrode layer 134 and the sacrificial gate dielectric layer 132 were removed. The trench 166 exposes portions of the cladding layer 117 and the top of the first semiconductor layer 106. The ILD layer 164 protects the epitaxial S/D features 146 during the removal of the sacrificial gate structure 130. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, and the CESL 162. In some embodiments, the gate spacers 138 may be recessed by the etchant used to remove the sacrificial gate electrode layer 134 and/or the sacrificial gate dielectric layer 132.

Figure 15C:
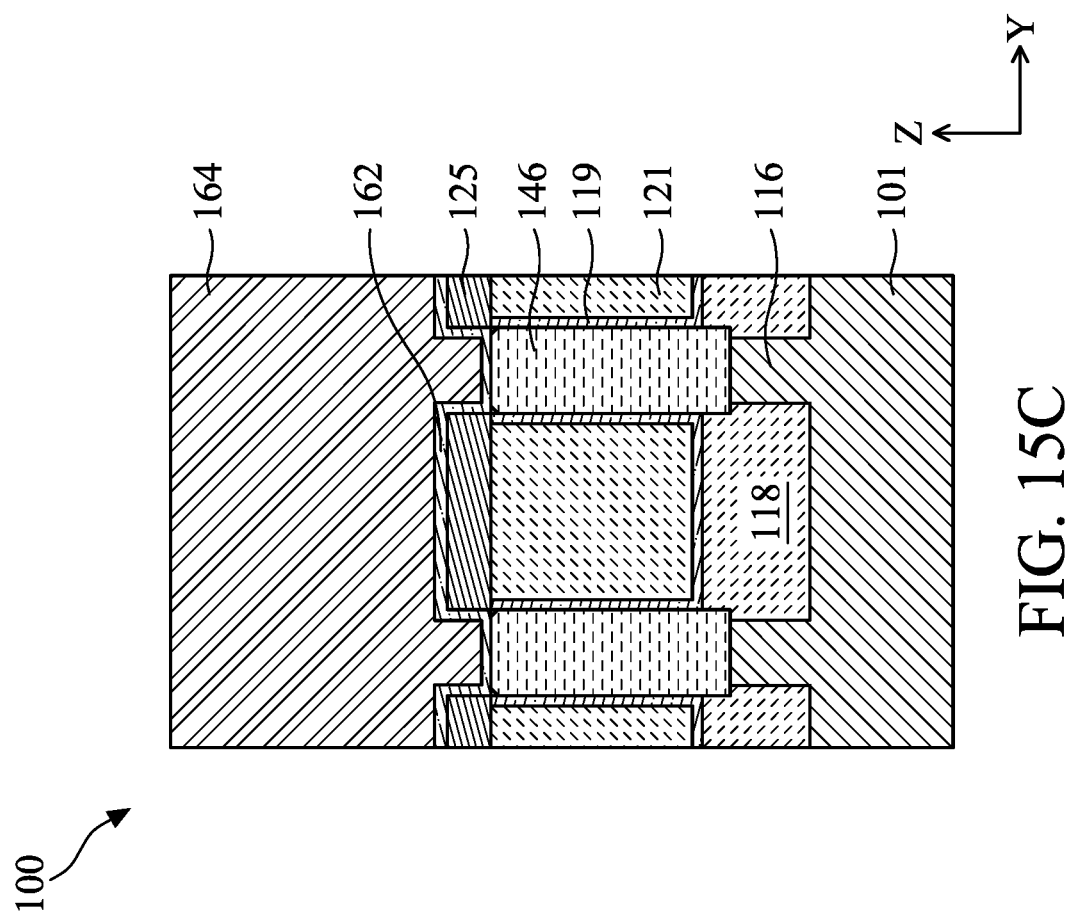

In FIGS. 15A-15C, the cladding layers 117 and the second semiconductor layers 108 are removed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may be a selective etch process that removes the cladding layers 117 (FIG. 14B) and the second semiconductor layers 108 but not the gate spacers 138, the CESL 162, the dielectric material 125, and the first semiconductor layers 106. As a result, openings 151 are formed around the first semiconductor layers 106, and the portion of the first semiconductor layers 106 not covered by the dielectric spacers 144 is exposed to the openings 151.

FIGS. 16-25 are enlarged views of a region 147 of FIG. 15B showing various stages of manufacturing the semiconductor device structure 100 in accordance with some embodiments. In FIG. 16, a dipole layer 150 is formed to surround the exposed surfaces of the first semiconductor layers 106 and on the well portion 116 of the substrate 101. Depending on the conductivity type of the nanosheet transistor, the dipole layer 150 may be configured to include positive polarity or negative polarity. The nanosheet transistor at the region 153 on one side of the dielectric feature 127 may be designated as a p-type FET or an n-type FET, and the region 155 on the other side of the dielectric feature 127 may be designated as an n-type FET or a p-type FET. Alternatively, both regions 153, 155 may be designated as a p-type FET or n-type FET. In any case, the dipole layer 150 serves to enhance or tune threshold voltage for the nanosheet transistor. In the embodiment shown in FIG. 16, the nanosheet transistor at the region 153 is designated as an n-type FET and the nanosheet transistor at the region 155 is designated as a p-type FET. In such cases, the dipole layer 150 can be a positive polarity dipole (p-dipole) layer formed from a material inherently including a positive polarity. For example, the dipole layer 150 may be a germanium-containing material, an aluminum-containing material, a titanium-containing material, or the like. In one embodiment, the dipole layer 150 is a germanium-containing material, such as pure germanium. The term "pure germanium" used herein refers to a material having at least 99.9% by weight of germanium element. In cases where the dipole layer 150 is formed of germanium, the semiconductive surfaces of the first semiconductor layers 106 and the well portion 116 promote selective growth of the dipole layer 150 thereon, with little or no dipole layer 150 grown on the dielectric surfaces of the insulating material 118, the liner 119, and the dielectric material 125. In some embodiments, the dipole layer 150 may further contain oxygen.

The dipole layer 150 can be formed by ALD, Atomic Layer Epitaxy (ALE), CVD, or any suitable conformal deposition technique to ensure uniform thickness of the dipole layer 150. Suitable source gas may include germanium-containing gas, which can be germane ($GeH_4$) or higher germanes, such as compounds with the empirical formula $Ge_xH_{(2x+2)}$, for example, digermane ($Ge_2H_6$), trigermane ($Ge_3H_8$), and tetragermane ($Ge_4H_{10}$), etc. Chlorinated germanium derivatives, such as germanium dichloride ($GeCl_2$), germanium tetrachloride ($GeCl_4$), or dichlorogermane ($GeCl_2H_2$), may also be used.

The dipole layer 150 has a uniform thickness on the exposed surfaces of the first semiconductor layers 106 and on the well portion 116 of the substrate 101. The thickness of the dipole layer 150 is chosen based on the threshold voltage needed for the nanosheet transistor and/or device performance considerations. In some embodiments, the dipole layer 150 has a thickness about 1 Angstrom to about 15 Angstrom. If the thickness of the dipole layer 150 is less than about 1 Angstrom, the dipole layer 150 may not function as intended for effective tuning of the threshold voltage for the p-type and/or n-type FETs. On the other hand, if the thickness of the dipole layer 150 is more than 15 Angstroms, the space created between nanosheet channels (e.g., first semiconductor layers 106) may not be enough for the subsequent layers (e.g., capping layer 157, HK dielectric layer 160, and gate electrode layer 172, etc.)

In some embodiments, the semiconductor device structure 100 is optionally subjected to a thermal treatment. Germanium in the dipole layer 150 are diffused into and mixed with silicon of the first semiconductor layers 106 and the well portion 116 to form an intermixed layer 129 as a result of the thermal treatment. The intermixed layer 129 can be considered as modified first semiconductor layer 106/well portion 116. The term "intermixed layer" as used in this disclosure denotes a reaction product of the first semiconductor layers 106/well portion 116 and the dipole layer 150, which can be a compound, a composition or a mixture, depending on the thermal treatment used. In some embodiments, the intermixed layer 129 can be a first semiconductor layer 106 doped with materials from the dipole layer 150. FIG. 16-a is an enlarged view of a portion of the semiconductor device structure 100 showing the intermixed layer 129 formed between the first semiconductor layer 106 and the dipole layer 150. The intermixed layer 129 has a SiGe concentration profile gradually and continuously changed along the thickness of the intermixed layer 129. In one embodiment, the intermixed layer 129 has a first concentration of SiGe at an interface of the intermixed layer 129 and the dipole layer 150 and the portions of the intermixed layer 129 at an interface of the intermixed layer 129 and the first semiconductor layer 106 have a second concentration of SiGe that is lower than the first concentration of SiGe.

The thermal treatment may be performed in-situ or ex-situ and can be any type of anneal, such as rapid thermal anneal, a spike anneal, a soak anneal, a laser anneal, a furnace anneal, etc. The thermal treatment may be performed for about 0.05 seconds to about 60 minutes, such as about 10 seconds to about 30 seconds, and at a temperature range of about 450° C. to about 1200° C. The thermal treatment may be performed in an atmosphere of gas, such as an oxygen-containing gas, a hydrogen-containing gas, an argon-containing gas, a helium-containing gas, or any combinations thereof. Exemplary gas may include, but are not limited to, $N_2$, $NH_3$, $O_2$, $N_2O$, Ar, He, H, etc.

Figure 17:
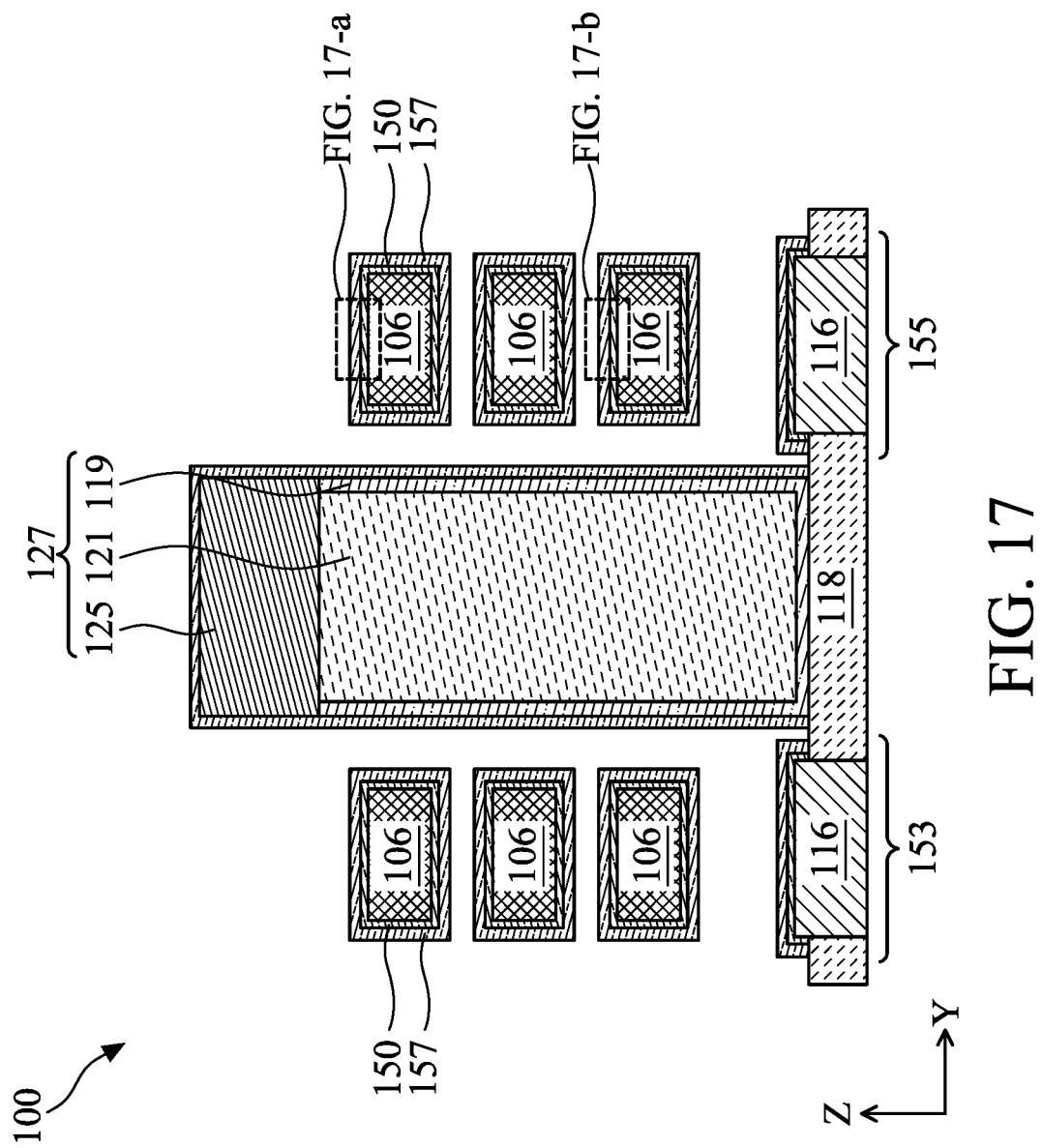

In FIG. 17, a capping layer 157 is formed on the exposed surfaces of the semiconductor device structure 100. The capping layer 157 is formed on the dipole layer 150 to surround the surfaces of the first semiconductor layers 106 and over the well portion 116 of the substrate 101. The capping layer 157 is also formed on the exposed surfaces of the liner 119 and the dielectric material 125. In some embodiments, the capping layer 157 may also form on a portion of the insulating material 118. The capping layer 157 prevent germanium in the underlying dipole layer 150 from penetrating through during the subsequent process, such as a pre-clean process. The capping layer 157 can reduce germanium loss of the p-dipole layer by at least 80%, allowing the p-dipole layer to provide greater threshold voltage tuning capability in a range from about −20 mV to about −650 mV. Since the germanium loss of the p-dipole layer is reduced, the throughput requirements of wafer per hour (WPH) can be improved.

The capping layer 157 may have a composition (including the elements contained therein and the percentage of the elements) different from the composition of the dipole layer 150. In some embodiments, the capping layer 157 may include or be made of an oxygen-containing material or a silicon-containing material, such as oxide, silicon oxide, silicon oxynitride, oxynitride, or the like, and may be formed by any suitable technique, such as ALD (thermal-ALD or PEALD), CVD, ozone oxidation, or any suitable conformal deposition process. In one embodiment, the capping layer 157 is an oxide. Optionally, the capping layer 157 is subjected to a pre-clean process to remove residues from exposed surfaces of the capping layer 157. The pre-clean process may be any suitable wet cleaning process such as an APM process, which includes at least water ($H_2O$), ammonium hydroxide ($NH_4OH$), and hydrogen peroxide ($H_2O_2$), a HPM process, which includes at least $H_2O$, $H_2O_2$, and hydrogen chloride (HCl), a SPM process (also known as piranha clean), which includes at least $H_2O_2$ and sulfuric acid ($H_2SO_4$), or any combination thereof. Portions of the capping layer 157 may be further oxidized upon completion of the pre-clean process to form an interfacial layer (IL) for the n-type and p-type FETs. FIG. 17-a is an enlarged view of a portion of the semiconductor device structure 100 showing an outer portion 159 of the capping layer 157 is oxidized to form an IL. That is, the outer portion 159 is or part of the IL. In some embodiments, the outer portion 159 has a thickness T1 of about 1 Angstroms to about 6 Angstroms.

In some embodiments, the capping layer is an oxide formed by oxidizing an outer portion of the dipole layer 150. FIG. 17-b illustrates an embodiment in which a capping layer 157' is formed by oxidizing an outer portion of the dipole layer 150. Therefore, the outer portion surrounds and in contact with the core dipole layer 150 upon completion of the oxidation. In cases where the dipole layer 150 is formed of germanium, the dipole layer 150 has the outer portion (i.e., the capping layer 157') containing germanium oxide and the inner portion (i.e., the core dipole layer 150) containing germanium. In some embodiments, the concentration of germanium in the germanium oxide is from about 1 atomic percent to about 60 atomic percent. In some embodiments, the concentration of germanium in the germanium oxide is about 10 atomic percent or above, for example about 20 atomic percent to about 50 atomic percent. The formation of a capping layer having germanium concentration of about 10 atomic percent or above on the nanosheet channels (e.g., first semiconductor layers 106 at the region 155) can improve carrier (e.g., holes) mobility for the p-type FET due to a compressive stress introduced by the capping layer 157' to the underlying nanosheet channels. Such compressive stress increases silicon hole mobility on (100)-oriented planes when (100) plane is used as a top surface of the nanosheet channels along the Y-direction.

The capping layer 157' may be formed using an oxidation process such as thermal oxidation process, a rapid thermal oxidation (RTO) process, an in-situ steam generation (ISSG) process, or an enhanced in-situ steam generation (EISSG) process. In one example, the capping layer 157' is formed by subjecting the dipole layer 150 to a rapid thermal anneal (RTA) in an oxygen-containing environment. The thermal oxidation may be performed at a temperature of about 600 degrees Celsius to about 1100 degrees Celsius, for a time span of about 10 seconds to about 30 seconds. The temperature and time span of the oxidation may contribute to the thickness of the capping layer 157'. For example, higher temperatures and longer oxidation time spans may result in a thicker capping layer 157'. The capping layer 157' may have a thickness T2 of about 0.5 Angstrom to about 5 Angstroms, which varies depending on the thickness and oxidation of the dipole layer 150.

In some embodiments, which can be combined with any one or more embodiments of this disclosure, the capping layer 157 may have the same composition as the first semiconductor layers 106. FIG. 18 illustrates an embodiment in which a capping layer 161 is formed of the same material as the first semiconductor layer 106. In one embodiment, the capping layer 161 is silicon, e.g., pure silicon. The term "pure silicon" used herein refers to a material having at least 99.9% by weight of silicon element. In another embodiment, the capping layer 161 is substantially pure silicon with, for example, less than 2 percent or 1 percent of germanium in the capping layer 161. The capping layer 161 may be formed in-situ (e.g., in the same process chamber where the dipole layer 150 was formed) or ex-situ using any suitable deposition process. In one embodiment, the capping layer 161 is a silicon layer formed by an epitaxial process. The epitaxial process may use a silicon-containing precursor such as silanes, halogenated silanes, organosilanes, or derivatives thereof, and a carrier gas such as hydrogen ($H_2$), nitrogen ($N_2$), argon, helium, or any combinations thereof. The capping layer 161 may have a thickness of about 6 Angstroms to about 20 Angstroms. After formation of the capping layer 161, a pre-clean process is performed to remove residues from exposed surfaces of the capping layer 161. The pre-clean process may be any suitable wet cleaning process such as an APM process, a HPM process, a SPM process, or any combination thereof, as discussed above. In some embodiments, portions of the capping layer 161 are oxidized upon completion the pre-clean process to form the interfacial layer for the n-type and p-type FETs. FIG. 19 illustrates an embodiment where surface portions of the capping layer 161 are oxidized to form an interfacial layer 163 (e.g., silicon oxide) wrapping around the first semiconductor layers 106, resulting in the capping layer 161 (e.g., silicon) disposed between the interfacial layer 163 and the dipole layer 150. The interfacial layer 163 may have a thickness T3 of about 1 Angstrom to about 4 Angstroms, which varies depending on the thickness and oxidation of the capping layer 161.

Figure 20:
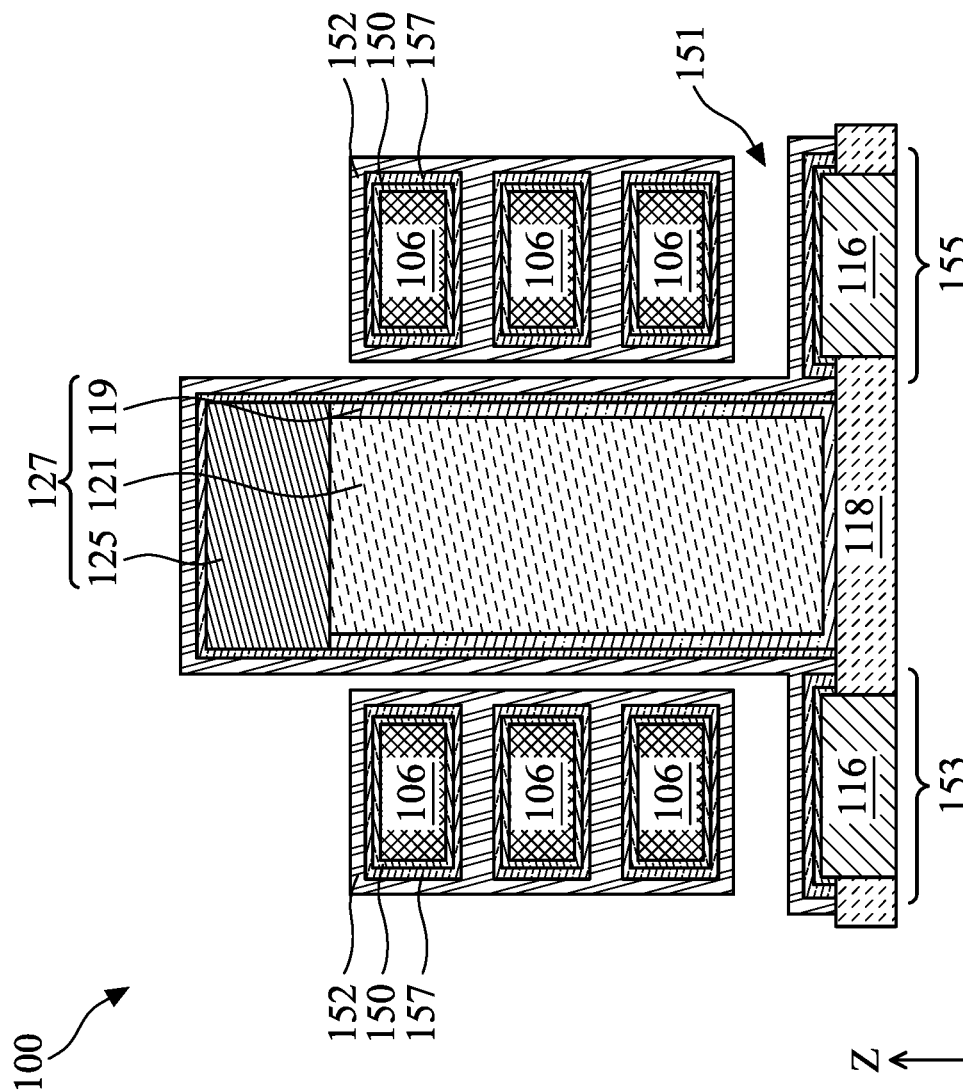

In FIG. 20, a hard mask 152 is formed on the exposed surfaces of the semiconductor device structure 100. The hard mask 152 is formed on the capping layer 157 (or on the capping layer 157' or the interfacial layer 163 in some alternative embodiments) to surround the surfaces of the first semiconductor layers 106 and over the well portion 116 of the substrate 101. The hard mask 152 is also formed on the capping layer 157 over the liner 119 and the dielectric material 125. The hard mask 152 may be a dielectric layer used to protect regions not being processed. In some embodiments, the hard mask 152 may be made of AlO, AN, Si, SiO, SiN, the like, or a combination thereof, and may be formed by any suitable deposition techniques such as ALD, CVD, PVD, etc. The hard mask 152 may have a thickness of about 1 nm to about 5 nm.

Figure 21:
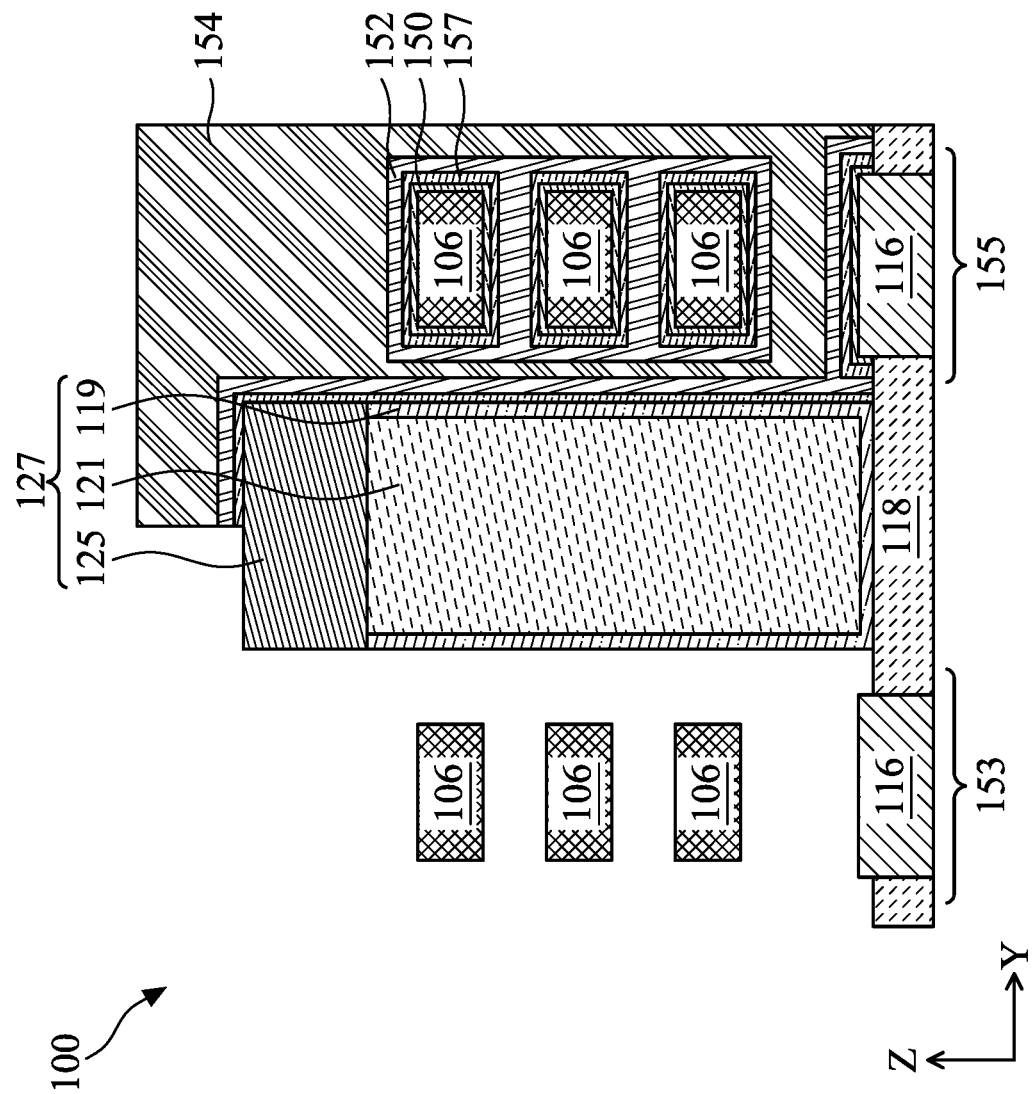

In FIG. 21, a mask layer 154 is formed to cover at least the nanosheet transistor at the region 155, which is designated as a p-type FET in some embodiments. The mask layer 154 first fills the openings 151 (FIG. 20) to a level so that the nanosheet transistors at the regions 153, 155 and the dielectric feature 127 are submerged in the mask layer 154. The mask layer 154 protects a portion of the hard mask 152 disposed on the capping layer 157 at the region 155 during the subsequent etching process of a portion of the hard mask 152 disposed on the capping layer 157 at the region 153. The mask layer 154 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique. Next, the mask layer 154 is patterned and etched to expose the nanosheet transistor at the region 153, which is designated as a n-type FET in some embodiments. The hard mask 152, the capping layer 157, and the dipole layer 150 at the region 153 not covered by the mask layer 154 are removed using ash process and/or one or more etch processes, such as dry etch, wet etch, or a combination thereof. The etch processes expose the surfaces of the first semiconductor layers 106 and the well portion 116 at the region 153. The etch processes also exposes portions of the liner 119 and the dielectric material 125, as shown in FIG. 21.

Depending on the applications, the threshold voltage of the n-type and/or p-type FETs at certain regions can be tuned by, for example, forming and varying the thickness of one or more dipole layers and work function metals, etc. In some embodiments, after the mask layer 154 is patterned and etched to expose the channels of the nanosheet transistor at the region 153, the removal process may only remove the hard mask 152 and the capping layer 157, while the dipole layer 150 at the region 153 is not removed. By keeping and/or removing the dipole layer in different regions, the nanosheet FETs in different regions of the semiconductor device structure can be operated at different threshold voltages.

Figure 22:
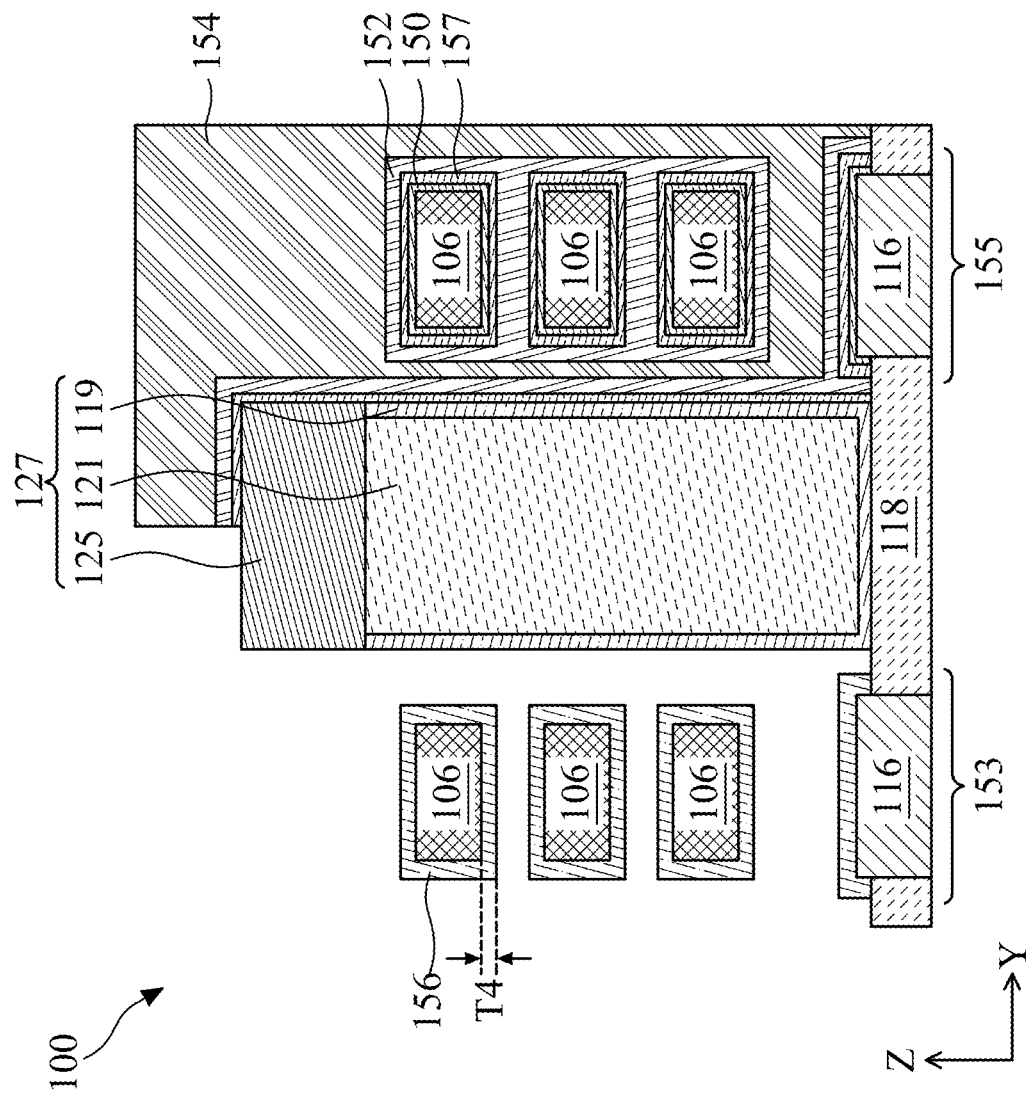

In FIG. 22, an interfacial layer (IL) 156 is formed to surround the exposed surfaces of the first semiconductor layers 106 at the region 153. In some embodiments, the IL 156 may also form on the well portion 116 of the substrate 101. The IL 156 may include or be made of an oxygen-containing material or a silicon-containing material, such as silicon oxide, silicon oxynitride, oxynitride, hafnium silicate, etc. In one embodiment, the IL 156 is silicon oxide. In some embodiments, the IL 156 is formed of a material different than the material of the interfacial layer 163 or the outer portion 159 of the capping layer 157. The IL 156 may be formed by CVD, ALD or any suitable conformal deposition technique. In one embodiment, the IL 156 is formed using ALD. The thickness of the IL 156 is chosen based on device performance considerations. In some embodiments, the IL 156 at the region 153 has a thickness T4 that is greater than the thickness T1 (FIG. 17-a), T2 (FIG. 17-b), or T3 (FIG. 19) at the region 155. In one embodiment, the IL 156 has a thickness T4 ranging from about 8 Angstroms to about 15 Angstroms.

Figure 23:
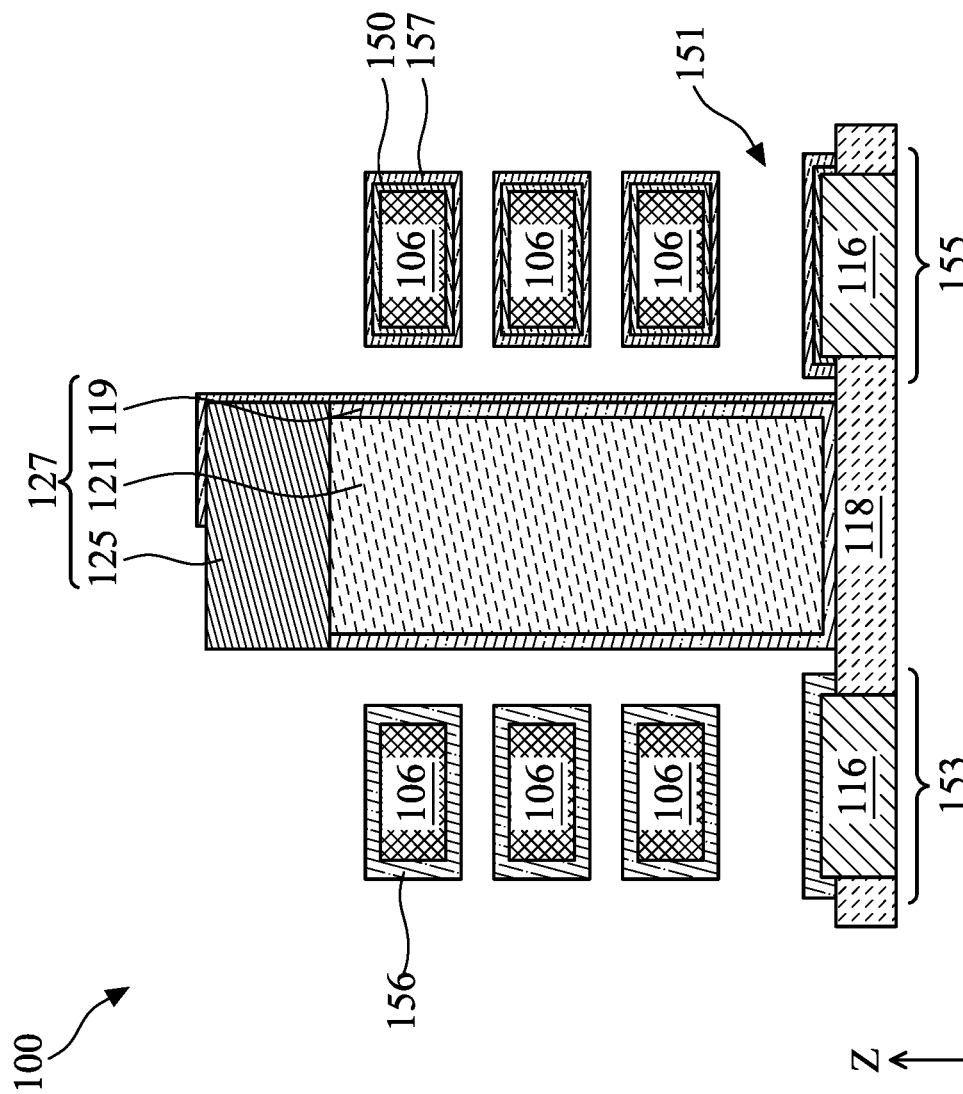

In FIG. 23, the mask layer 154 and the hard mask 152 are removed. The mask layer 154 and the hard mask 152 may be removed using ash process and/or one or more etch processes, such as dry etch, wet etch, or a combination thereof. The etch selectivity of the materials is chosen so that the removal process selectively removes the mask layer 154 and the hard mask 152 but not the capping layer 157 and the IL 156. The openings 151 over the region 155 are revealed upon removal of the mask layer 154 and the hard mask 152, exposing the capping layer 157 (or the capping layer 157' or the interfacial layer 163 in some alternative embodiments) surrounding the first semiconductor layers 106 at the region 155. In some embodiments, the exposed surfaces of the capping layer 157 and the IL 156 are further subjected to a wet cleaning process such as an APM process, a HPM process, a SPM process, or any combination thereof, as discussed above.

Figure 24:
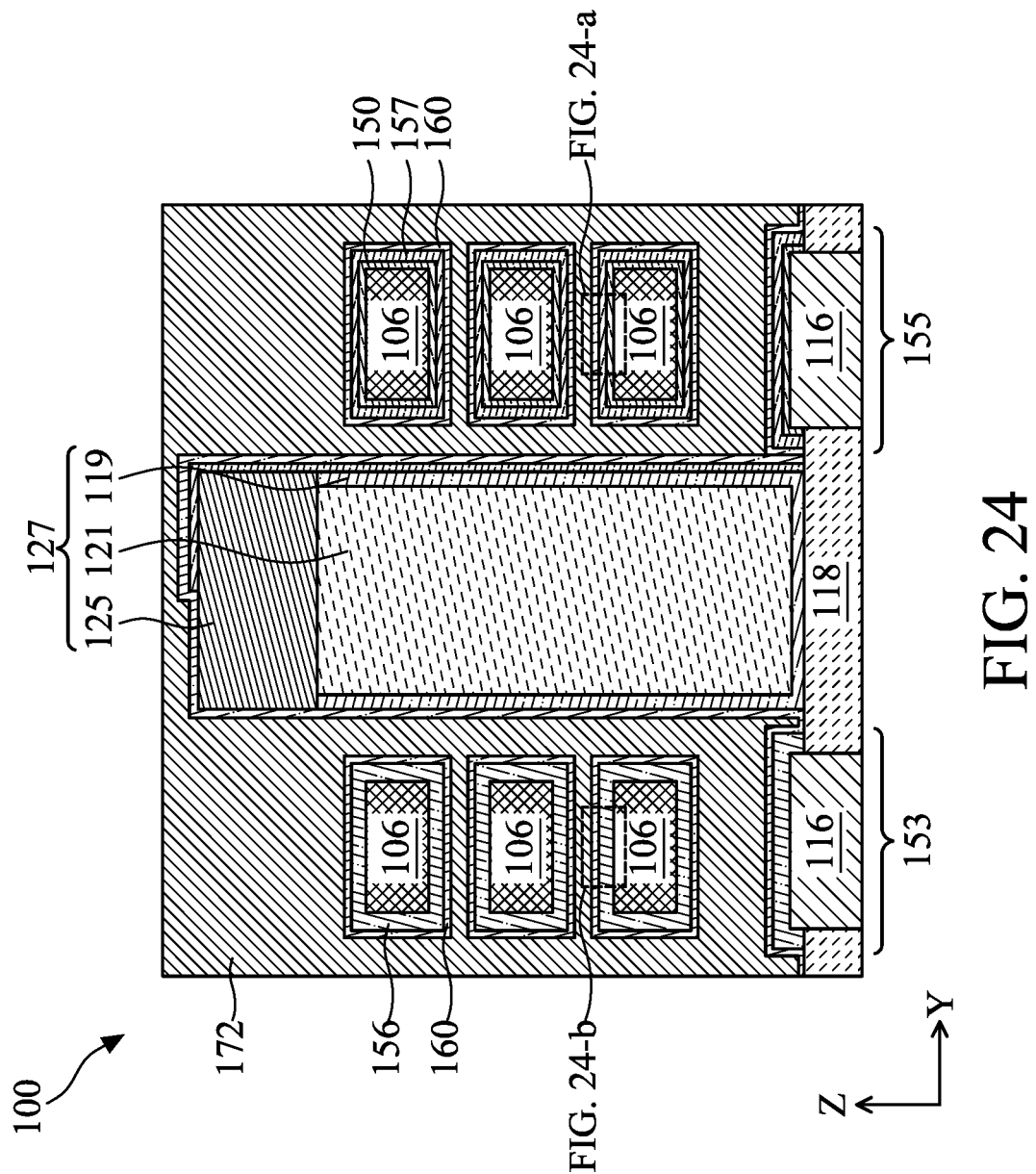
Figures 26C, 26D:
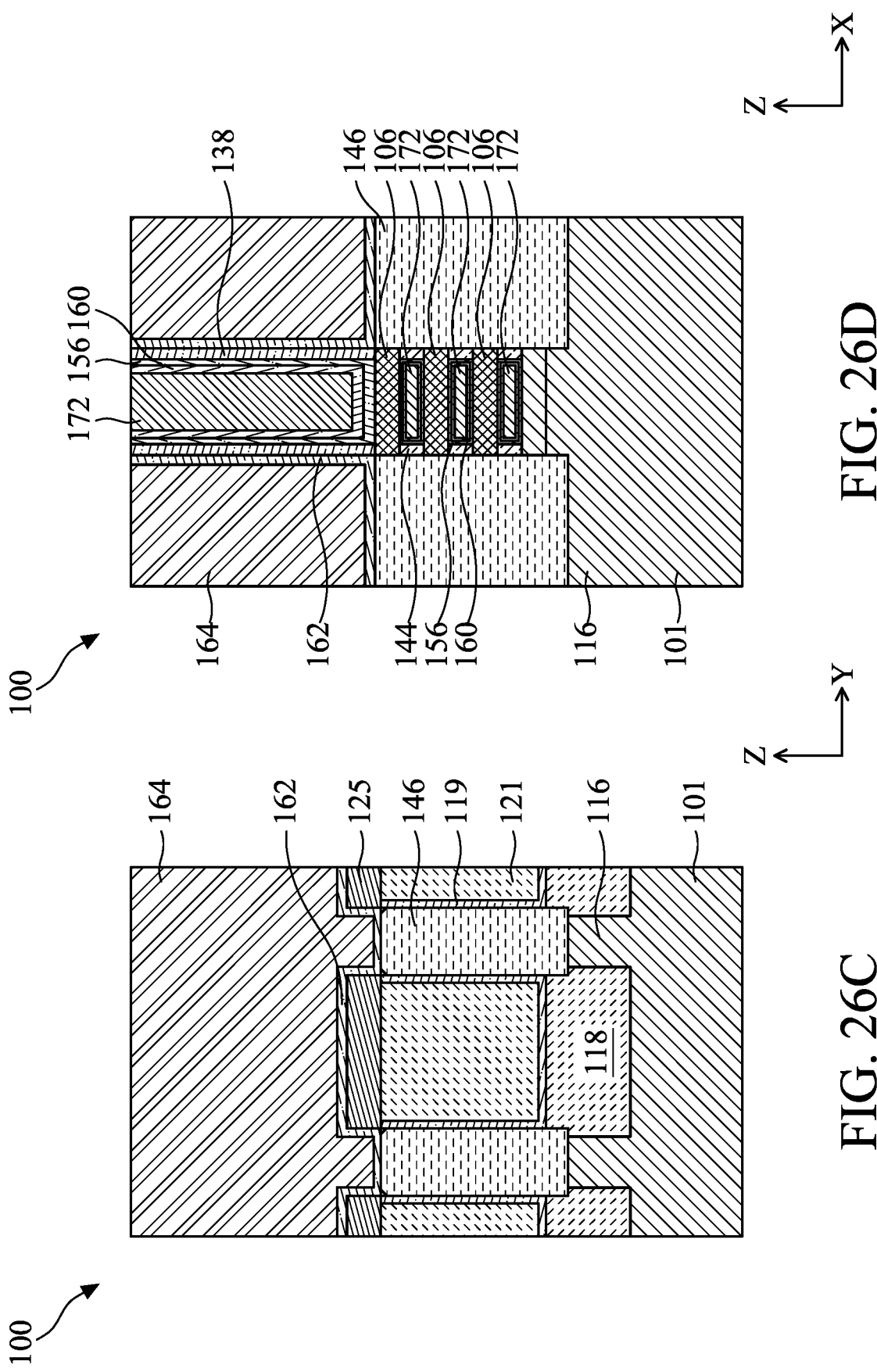

In FIG. 24, a high-K (HK) dielectric layer 160 is formed on the exposed surfaces of the semiconductor device structure 100. In some embodiments, the HK dielectric layer 160 is formed to wrap around and in contact with the capping layer 157 (or the capping layer 157' or the interfacial layer 163 in some alternative embodiments) over the first semiconductor layers 106 at both regions 153, 155. The HK dielectric layer 160 also forms on and in contact with the liner 119 and the dielectric material 125 not covered by the capping layer 157. The HK dielectric layer 160 may include or made of hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The HK dielectric layer 160 may be a conformal layer formed by a conformal process, such as an ALD process or a CVD process. The HK dielectric layer 160 may have a thickness ranging from about 5 Angstroms to about 30 Angstroms.

Next, a gate electrode layer 172 is formed on the HK dielectric layer 160. The gate electrode layer 172 fills the opening 151 (FIG. 23) and surrounds a portion of each first semiconductor layer 106 at the region 153, 155. The gate electrode layer 172 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 172 may be formed by PVD, CVD, ALD, electro-plating, or other suitable method. In some embodiments, the gate electrode layer 172 includes a p-type gate electrode layer such as TiN, TaN, TiTaN, TiAlN, WCN, W, Ni, Co, or other suitable material.

In some embodiments, which can be combined with one or more embodiments discussed in this disclosure, an optional dipole layer may be formed between the HK dielectric layer 160 and the gate electrode layer 172. Depending on the conductivity type of the nanosheet transistor at the regions 153, 155, the optional dipole layer may be configured to include positive polarity or negative polarity. The optional dipole layer serves to enhance or modify threshold voltage for the nanosheet transistor at the regions 153, 155. In cases where the nanosheet transistor at the region 155 is a p-type FET, the optional dipole layer can be a positive polarity dipole (p-dipole) layer formed using ALD, CVD, or any suitable conformal deposition technique. FIG. 24-a illustrates an embodiment where a p-dipole layer 165 is formed between the HK dielectric layer 160 and the gate electrode layer 172 of the nanosheet transistor at the region 155. Suitable materials for the p-dipole layer 165 may include, but are not limited to, aluminum oxide ($Al_2O_3$), titanium dioxide ($TiO_2$), germanium oxide ($GeO_2$), zinc oxide (ZnO), gallium oxide (GaO), or the like and material combination of above mentioned. In some embodiments, the p-dipole layer 165 can be formed of the same material as the dipole layer 150. FIG. 24-b illustrates another embodiment where an n-dipole layer 167 is formed between the HK dielectric layer 160 and the gate electrode layer 172 of the nanosheet transistor at the region 153. Suitable materials for the n-dipole layer 167 may include, but are not limited to, lanthanum oxide (La$_2$O$_3$), magnesium oxide (MgO), yttrium oxide (Y$_2$O$_3$), gadolinium oxide (Gd$_2$O$_3$), or the like, or any combinations thereof. The thickness of the p-dipole layer 165 or the n-dipole layer 167 may vary in a range from about 5 Angstroms to about 20 Angstroms.

In some embodiments, which can be combined with one or more embodiments discussed in this disclosure, an optional gate electrode layer may be formed between the HK dielectric layer 160 and the gate electrode layer 172 of the nanosheet transistor at the region 153. The optional gate electrode layer may also form on the HK dielectric layer 160 over the liner 119, the dielectric material 125, and the well portion 116 of the substrate 101. The optional gate electrode layer may be an n-type gate electrode layer or a p-type gate electrode layer, depending on the application. The optional gate electrode layer may include one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. FIG. 25 illustrates an embodiment where an n-type gate electrode layer 174 is formed between the HK dielectric layer 160 and the gate electrode layer 172 of the nanosheet transistor at the region 153. In some embodiments, the n-type gate electrode layer 174 includes TiAlC, TaAlC, TiSiAlC, TiC, TaSiAlC, or other suitable material.

FIGS. 26A-26D and 27A-27D are cross-sectional views of one of the various stages of manufacturing the semiconductor device structure 100 taken along cross-sections A-A, B-B, C-C, and D-D of FIG. 8, in accordance with some embodiments. Cross-section D-D is in a plane parallel to cross-section A-A and is in the fin structure 112 (FIG. 8) along the X direction. Specifically, FIGS. 26A-26D illustrates the stage after the gate electrode layer 172 are formed to wrap around a portion of the first semiconductor layers 106 at the regions 153, 155.

Figures 27C, 27D:
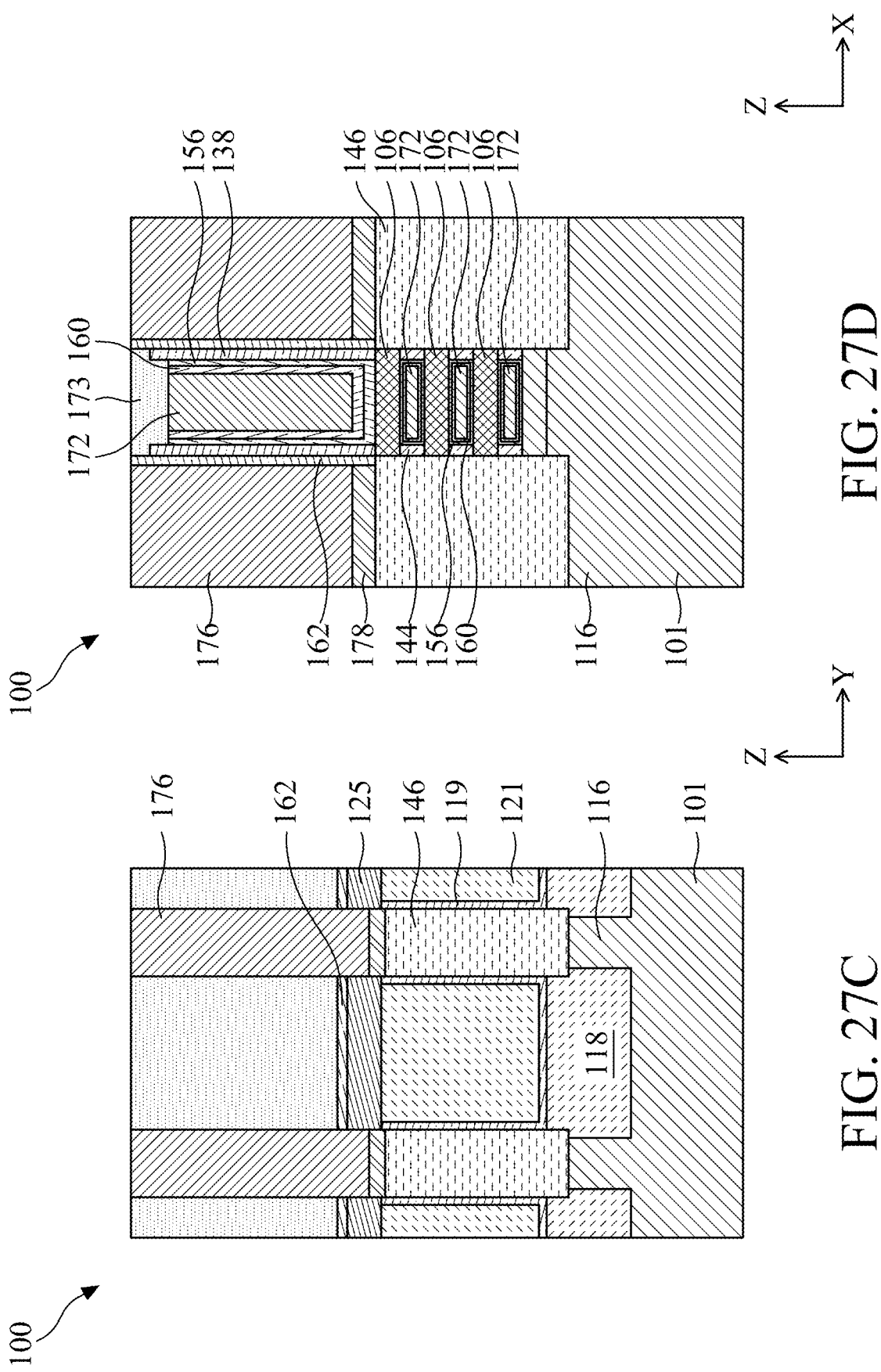

In FIGS. 27A-27D, one or more metal gate etching back (MGEB) processes are performed on the n-type and p-type FETs at regions 153, 155. The MGEB processes are performed so that the top surfaces of the gate electrode layer 172, the HK dielectric layer 160, the IL 156 (FIG. 27D), and the capping layer 157 (FIG. 27A) are recessed to a level below the top surface of the gate spacers 138. In some embodiments, the gate spacers 138 are also recessed to a level below the top surface of the CESL 162, as shown in FIG. 27A. A self-aligned contact layer 173 is formed over the gate electrode layer 172, the HK dielectric layer 160, the IL 156, and the capping layer 157 between the gate spacers 138. The self-aligned contact layer 173 may be a dielectric material having an etch selectivity relative to the gate spacers 138. In some embodiments, the self-aligned contact layer 173 includes silicon nitride. The self-aligned contact layer 173 can be used to define self-aligned contact regions for the semiconductor device structure 100.

After formation of the self-aligned contact layer 173, contact openings are formed through the ILD layer 164 and the CESL 162 (FIGS. 26A and 26D) to expose the epitaxial S/D feature 146. A silicide layer 178 is then formed on the epitaxial S/D features 146 to conductively couple the epitaxial S/D features 146 to the subsequently formed S/D contacts 176. The silicide layer 178 may be formed by depositing a metal source layer over the epitaxial S/D features 146 and performing a rapid thermal annealing process. The metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. During the rapid thermal anneling process, the portion of the metal source layer over the epitaxial S/D features 146 reacts with silicon in the epitaxial S/D features 146 to form the silicide layer 178. Unreacted portion of the metal source layer is then removed.

After formation of the silicide layer 178, a conductive material is formed in the contact openings and form the S/D contacts 176. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and expose the top surface of the self-aligned contact layer 173.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 146 to a backside power rail (e.g., positive voltage VDD or negative voltage VSS) through the backside contacts. Depending on the application, the source or drain feature/terminal of the epitaxial S/D features 146 and the gate electrode layer 172 may be connected to a frontside power source.

Various embodiments or examples described herein offer multiple advantages over the state-of-art technology. According to embodiments of the present disclosure, a positive polarity dipole (p-dipole) layer formed of pure germanium is disposed between nanosheet channels of p-type nanosheet FETs and an interfacial layer (or HK dielectric layer). The p-dipole layer is capped with an oxide capping layer to prevent germanium in the underlying dipole layer from penetrating through during the subsequent process, such as a pre-clean process. The capping layer reduces germanium loss of the p-dipole layer by at least 80%, allowing the p-dipole layer to provide greater threshold voltage tuning capability in a range from about −20 mV to about −650 mV. Since the germanium loss of the p-dipole layer is reduced, the throughput requirements of wafer per hour (WPH) can be improved. In some embodiments, the capping layer is germanium oxide having germanium concentration of about 10 atomic percent or above, which can improve carrier mobility for p-type nanosheet FETs due to a compressive stress the capping layer introduced to the underlying nanosheet channels.

An embodiment is a semiconductor device structure. The structure includes one or more first semiconductor layers, and a dipole layer surrounding each first semiconductor layer of the one or more first semiconductor layers, wherein the dipole layer comprises germanium. The structure also includes a capping layer surrounding and in contact with the dipole layer, wherein the capping layer comprises silicon, one or more second semiconductor layers disposed adjacent the one or more first semiconductor layers. The structure further includes a gate electrode layer surrounding each first semiconductor layer of the one or more first semiconductor layers and each second semiconductor layer of the one or more second semiconductor layers.

Another embodiment is a semiconductor device structure. The structure includes a dielectric feature, one or more first semiconductor layers disposed adjacent a first side of the dielectric feature, a first dipole layer surrounding each first semiconductor layer of the one or more first semiconductor layers, wherein the first dipole layer comprises germanium. The structure also includes a first interfacial layer surrounding the first dipole layer, wherein the first interfacial layer comprises an oxygen-containing material, and the first interfacial layer has a first thickness. The structure also includes one or more second semiconductor layers disposed adjacent a second side of the dielectric feature, and a second interfacial layer surrounding each second semiconductor layer of the one or more second semiconductor layers, wherein the second interfacial layer comprises an oxygen-containing material, and the second interfacial layer has a second thickness greater than the first thickness. The structure further includes a first gate electrode layer surrounding each first semiconductor layer of the one or more first semiconductor layers and each second semiconductor layer of the one or more second semiconductor layers.

A further embodiment is a method for forming a semiconductor device structure. The method includes forming a first fin structure and a second fin structure, each first and second fin structure comprises a plurality of first semiconductor layers and a plurality of second semiconductor layers alternatingly stacked, forming a sacrificial gate structure over the first and second fin structures, forming a source/drain feature on opposite sides of the sacrificial gate structure, the source/drain feature being in contact with the plurality of first semiconductor layers of the first and second fin structures, removing portions of the plurality of second semiconductor layers to expose portions of each of the plurality of first semiconductor layers of the first and second fin structures, forming a dipole layer to surround exposed portions of each of the plurality of first semiconductor layers of the first fin structure, wherein the dipole layer comprises germanium. The method also includes forming a capping layer to surround and in contact with the dipole layer, forming a first interfacial layer to surround the capping layer, forming a second interfacial layer to surround exposed portions of each of the plurality of first semiconductor layers of the second fin structure, and forming a gate electrode layer to surround each of the plurality of first semiconductor layers of the first and second fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
    forming a first fin structure and a second fin structure, each first and second fin structure comprises a plurality of first semiconductor layers and a plurality of second semiconductor layers alternatingly stacked;
    forming a sacrificial gate structure over the first and second fin structures;
    forming a source/drain feature on opposite sides of the sacrificial gate structure, the source/drain feature being in contact with the plurality of first semiconductor layers of the first and second fin structures;
    removing the sacrificial gate structure and portions of the plurality of second semiconductor layers to expose portions of each of the plurality of first semiconductor layers of the first and second fin structures;
    forming a dipole layer to surround exposed portions of each of the plurality of first semiconductor layers of the first and second fin structures formed as a result of the removal of the sacrificial gate structure and the second semiconductor layers, wherein the dipole layer comprises germanium;
    subjecting the dipole layer over the first and second fin structures to a thermal treatment such that portions of germanium in the dipole layer diffuse into and mix with each of the plurality of first and second semiconductor layers of the first and second fin structures to form an intermixed layer, wherein the intermixed layer has a Ge concentration profile gradually and continuously changed along a thickness of the intermixed layer;
    forming a capping layer to surround and in contact with the dipole layer, wherein forming a capping layer further comprises:
        forming a pure silicon layer on the dipole layer; and
        subjecting the pure silicon layer to a wet cleaning process to oxidize a surface portion of the silicon layer;
    forming a first interfacial layer to surround the capping layer;
    forming a second interfacial layer to surround exposed portions of each of the plurality of first semiconductor layers of the second fin structure; and
    forming a gate electrode layer to surround each of the plurality of first semiconductor layers of the first and second fin structures.

2. The method of claim 1, wherein forming a capping layer further comprises:
    oxidizing an outer portion of the dipole layer, and the outer portion comprises germanium oxide.

3. The method of claim 1, further comprising:
    forming a high-K (HK) dielectric layer between the gate electrode layer and the second interfacial layer.

4. The method of claim 1, further comprising:
    prior to forming the first interfacial layer, subjecting the capping layer to a pre-clean process.

5. A method for forming a semiconductor device structure, comprising:
    forming a sacrificial gate structure over a portion of first and second fin structures, each first and second fin structure comprises a plurality of first semiconductor layers and a plurality of second semiconductor layers alternatingly stacked;
    forming a source/drain feature on opposite sides of the sacrificial gate structure, the source/drain feature being in contact with the plurality of first semiconductor layers of the first and second fin structures;
    removing the sacrificial gate structure and the plurality of second semiconductor layers to expose portions of each of the plurality of first semiconductor layers of the first and second fin structures;
    forming a dipole layer to surround exposed portions of each of the plurality of first semiconductor layers of the first and second fin structures, wherein the dipole layer comprises germanium;

subjecting the dipole layer over the first and second fin structures to a thermal treatment such that portions of germanium in the dipole layer diffuse into and mix with each of the plurality of first semiconductor layers of the first and second fin structures to form an intermixed layer, wherein the intermixed layer has a Ge concentration profile gradually and continuously changed along a thickness of the intermixed layer;

forming a capping layer to surround and in contact with the dipole layer;

forming an interfacial layer (IL) to surround the capping layer; and forming a gate electrode layer to surround each of the plurality of first semiconductor layers of the first and second fin structures.

6. The method of claim 5, wherein the capping layer comprises silicon.

7. The method of claim 6, further comprising:
prior to forming an interfacial layer, subjecting the capping layer to a pre-clean process to oxidize a portion of the capping layer.

8. The method of claim 5, wherein the capping layer is formed by oxidizing an outer portion of the dipole layer.

9. The method of claim 8, wherein the outer portion of the dipole layer has a concentration of germanium in a range of about 20 atomic percent to about 50 atomic percent.

10. The method of claim 8, further comprising:
after oxidizing an outer portion of the dipole layer, subjecting the capping layer to a pre-clean process to further oxidize the capping layer.

11. The method of claim 8, further comprising:
forming a high-K (HK) dielectric layer between the gate electrode layer and the IL layer.

12. A method for forming a semiconductor device structure, comprising:
forming a sacrificial gate structure over a portion of first and second fin structures, each first and second fin structure comprises a plurality of first semiconductor layers and a plurality of second semiconductor layers alternatingly stacked;

forming a source/drain feature on opposite sides of the sacrificial gate structure, the source/drain feature being in contact with the plurality of first semiconductor layers of the first and second fin structures;

removing the sacrificial gate structure and the plurality of second semiconductor layers to expose portions of each of the plurality of first semiconductor layers of the first and second fin structures;

forming a dipole layer to surround exposed portions of each of the plurality of first semiconductor layers of the first and second fin structures, wherein the dipole layer comprises germanium;

subjecting the dipole layer to a thermal treatment such that portions of germanium in the dipole layer diffuse into and mix with each of the plurality of first semiconductor layers to form an intermixed layer, wherein the intermixed layer has a Ge concentration profile gradually and continuously changed along a thickness of the intermixed layer;

forming a capping layer to surround and in contact with the dipole layer;

forming a first interfacial layer to surround the capping layer; and forming a gate electrode layer to surround each of the plurality of first semiconductor layers of the first and second fin structures.

13. The method of claim 12, wherein the capping layer comprises silicon.

14. The method of claim 12, wherein the first interfacial layer is formed by oxidizing an outer portion of the capping layer.

15. The method of claim 12, further comprising:
prior to forming a gate electrode layer, removing the first interfacial layer, the capping layer, and the dipole layer from the second fin structure until portions of each of the plurality of first semiconductor layers of the second fin structure are exposed; and forming a second interfacial layer to surround exposed portions of each of the plurality of first semiconductor layers of the second fin structure.

16. The method of claim 15, further comprising:
forming a high-K (HK) dielectric layer between the gate electrode layer and the first interfacial layer, as well as the gate electrode layer and the second interfacial layer.

17. The method of claim 16, further comprising:
after forming the HK dielectric layer, forming an n-dipole layer between the HK dielectric layer and the gate electrode layer.

18. The method of claim 16, wherein the first interfacial layer is germanium oxide and the second interfacial layer is silicon oxide.

19. The method of claim 16, wherein the first interfacial layer and the second interfacial layer comprises the same material.

* * * * *